(12) United States Patent
Takenaka et al.

(10) Patent No.: US 9,048,154 B2
(45) Date of Patent: Jun. 2, 2015

(54) RADIATION IMAGING APPARATUS AND IMAGING SYSTEM

(71) Applicant: CANON KABUSHIKI KAISHA, Tokyo (JP)

(72) Inventors: Katsuro Takenaka, Honjo (JP); Toshio Kameshima, Kumagaya (JP); Tomoyuki Yagi, Honjo (JP); Hideyuki Okada, Honjo (JP); Sho Sato, Kumagaya (JP); Atsushi Iwashita, Honjo (JP); Eriko Sugawara, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 156 days.

(21) Appl. No.: 13/779,887

(22) Filed: Feb. 28, 2013

(65) Prior Publication Data

US 2013/0240712 A1    Sep. 19, 2013

(30) Foreign Application Priority Data

Mar. 16, 2012  (JP) .................................. 2012-061148
Jan. 28, 2013  (JP) .................................. 2013-013734

(51) Int. Cl.
| | |
|---|---|
| *H01L 27/146* | (2006.01) |
| *H04N 5/32* | (2006.01) |
| *H04N 5/361* | (2011.01) |

(52) U.S. Cl.
CPC ............ *H01L 27/14612* (2013.01); *H04N 5/32* (2013.01); *H04N 5/361* (2013.01)

(58) Field of Classification Search
CPC ..... H01L 27/14612; H04N 5/32; H04N 5/361
USPC .................... 250/208.1, 369, 370.09, 370.14; 378/98.8
See application file for complete search history.

(56) References Cited

U.S. PATENT DOCUMENTS

| | | | |
|---|---|---|---|
| 5,572,257 A | 11/1996 | Conrads et al. ............... | 348/308 |
| 7,541,591 B2 | 6/2009 | Endo et al. ..................... | 250/369 |
| 2007/0096032 A1* | 5/2007 | Yagi et al. ................ | 250/370.11 |

(Continued)

FOREIGN PATENT DOCUMENTS

| | | |
|---|---|---|
| EP | 0517303 | 12/1992 |
| EP | 2579577 | 4/2013 |

(Continued)

OTHER PUBLICATIONS

Extended European Search Report issued on Mar. 6, 2015, in counterpart European patent application 13158891.5 (in English).

*Primary Examiner* — Seung C Sohn
(74) *Attorney, Agent, or Firm* — Fitzpatrick, Cella, Harper & Scinto

(57) ABSTRACT

A radiation imaging apparatus, comprising an imaging unit in which a plurality of pixels are arranged to form a plurality of rows and a plurality of columns, and a control unit configured to control the imaging unit so as to perform reset operation for initializing each of the plurality of pixels repeatedly, and readout operation, after the reset operation, for reading out a signal from each of the plurality of pixels sequentially, wherein one cycle length of the reset operation is shorter than a period of time required for the readout operation, and a pulse width of a signal supplied to each of the plurality of pixels in the reset operation is shorter than a pulse width of a signal supplied to each of the plurality of pixels in the readout operation.

18 Claims, 19 Drawing Sheets

(56) References Cited

U.S. PATENT DOCUMENTS

| | | | |
|---|---|---|---|
| 2007/0125952 A1 | 6/2007 | Endo et al. | 250/369 |
| 2007/0131843 A1* | 6/2007 | Yokoyama et al. | 250/205 |
| 2007/0183573 A1* | 8/2007 | Kameshima et al. | 378/98.9 |
| 2007/0210258 A1* | 9/2007 | Endo et al. | 250/370.09 |

FOREIGN PATENT DOCUMENTS

| | | |
|---|---|---|
| JP | 2007-151761 | 6/2007 |
| JP | 2010-268171 | 11/2010 |
| WO | 2011/152093 A | 12/2011 |

* cited by examiner

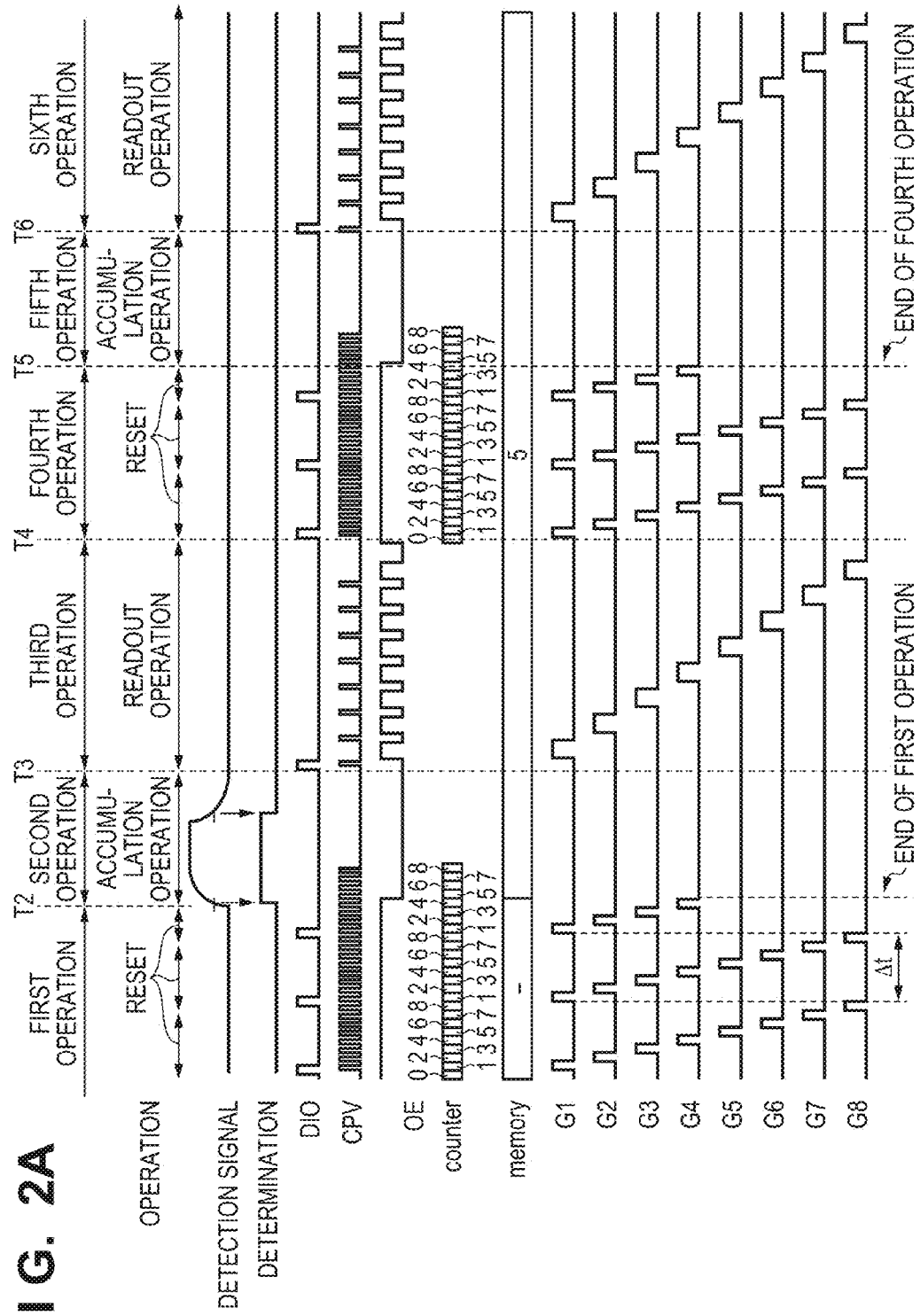

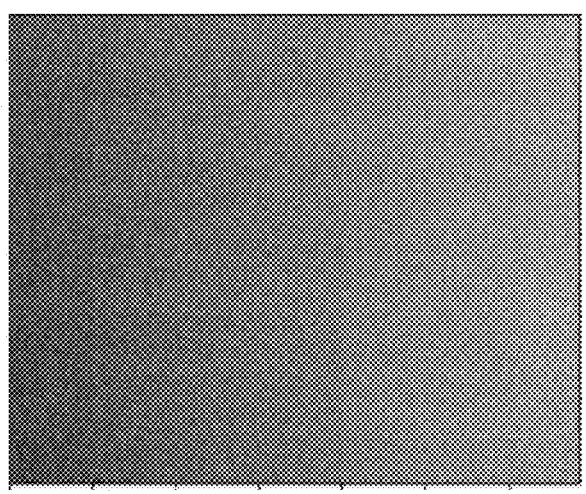
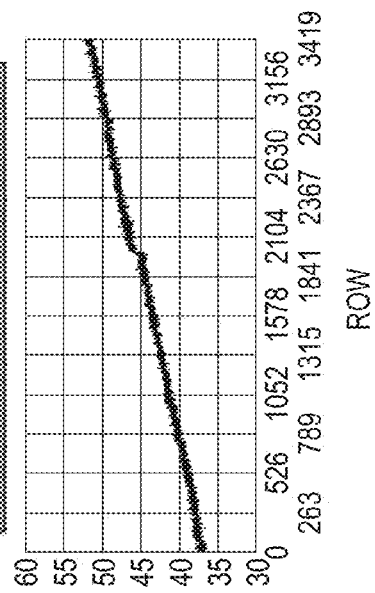
FIG. 5A
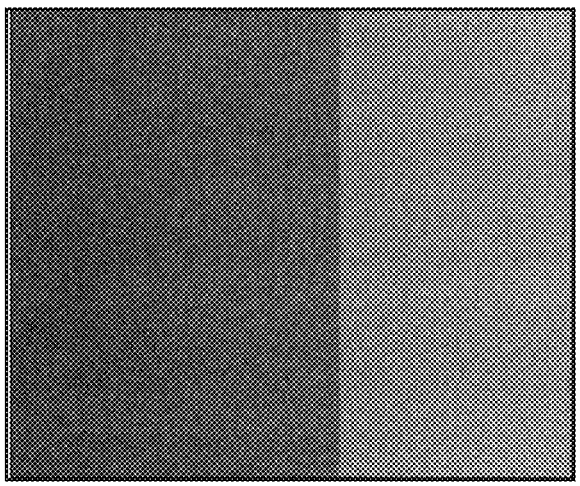
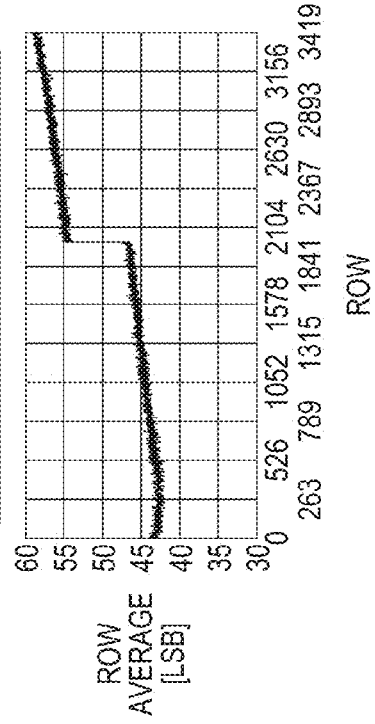
FIG. 5B

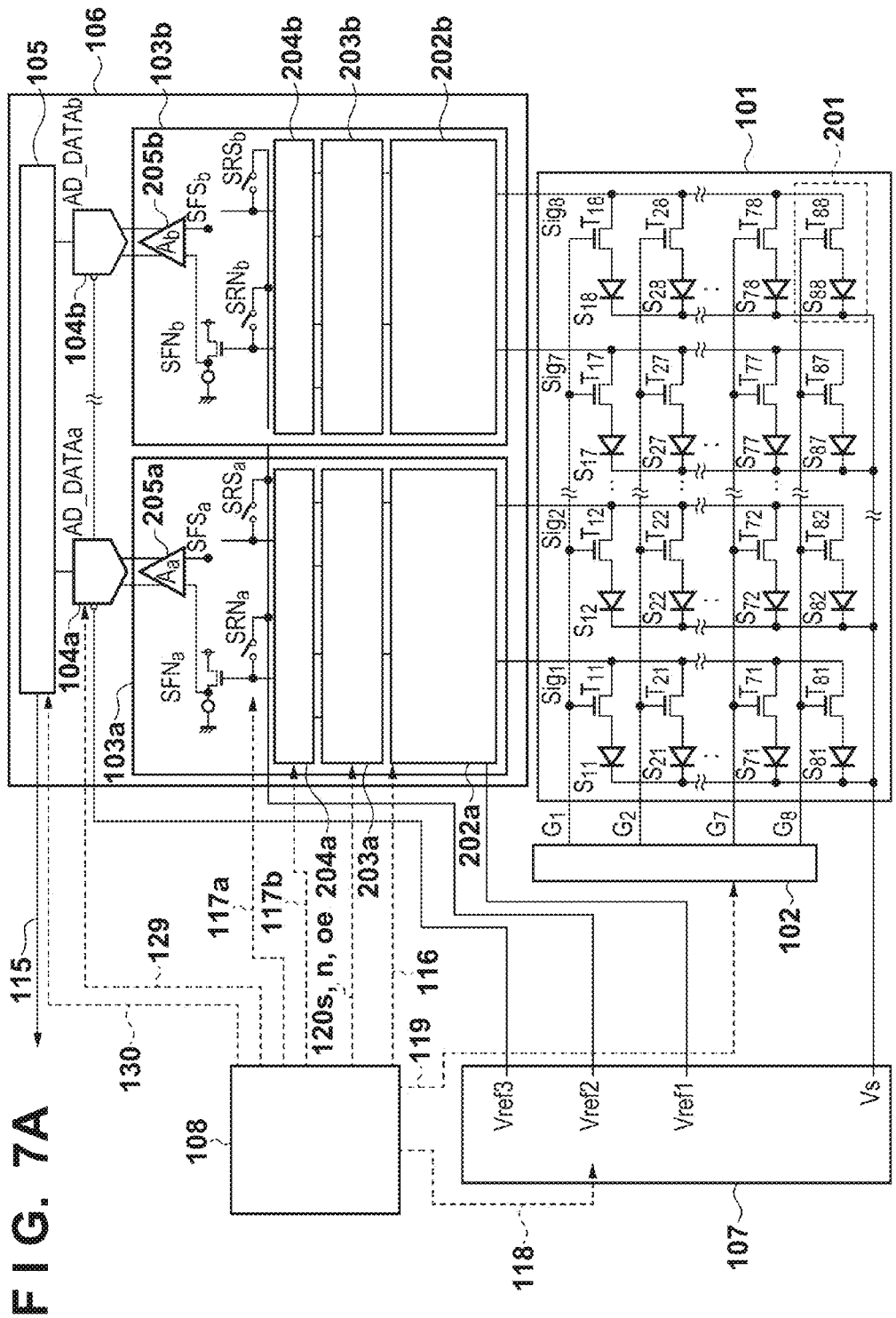

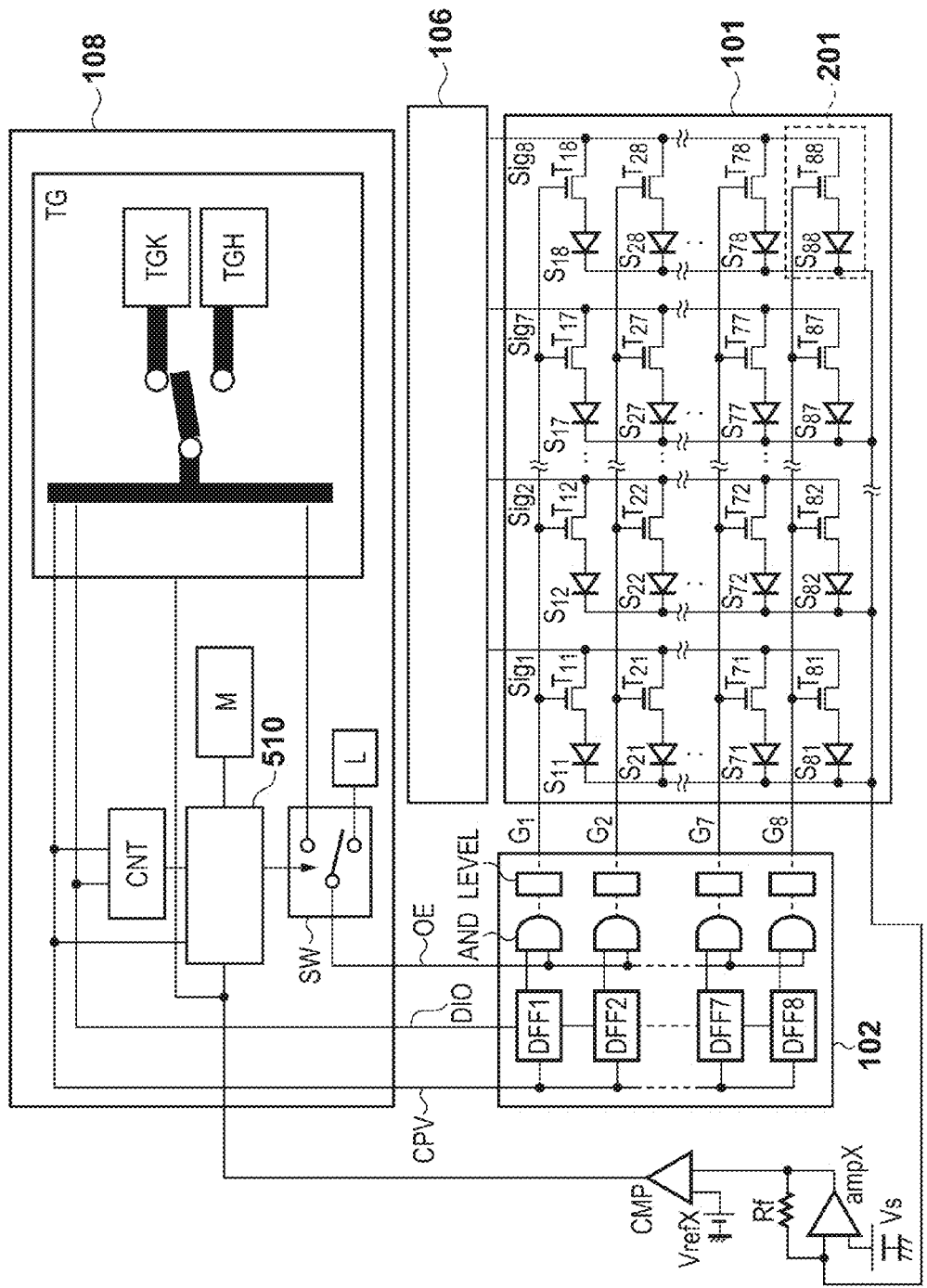

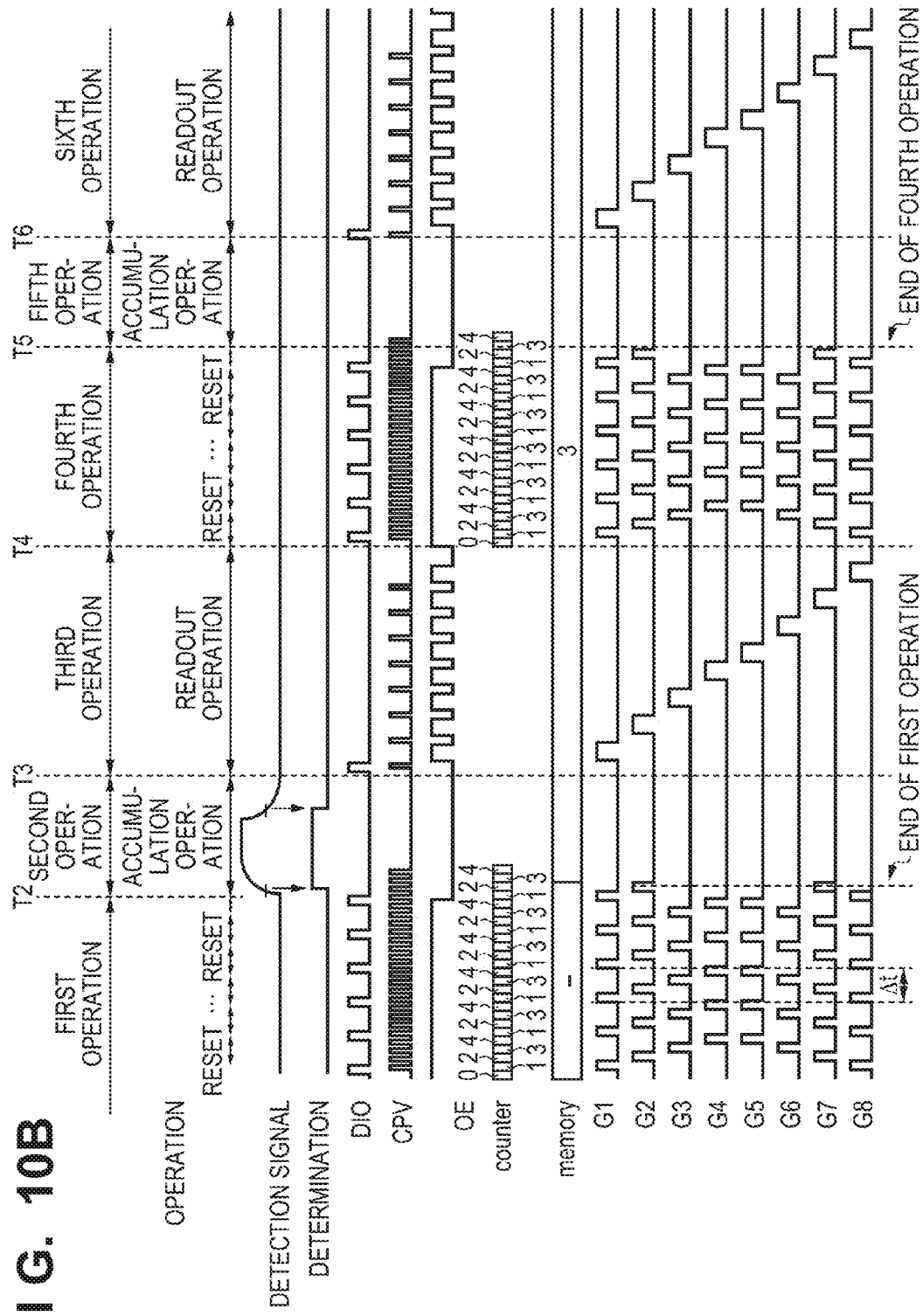

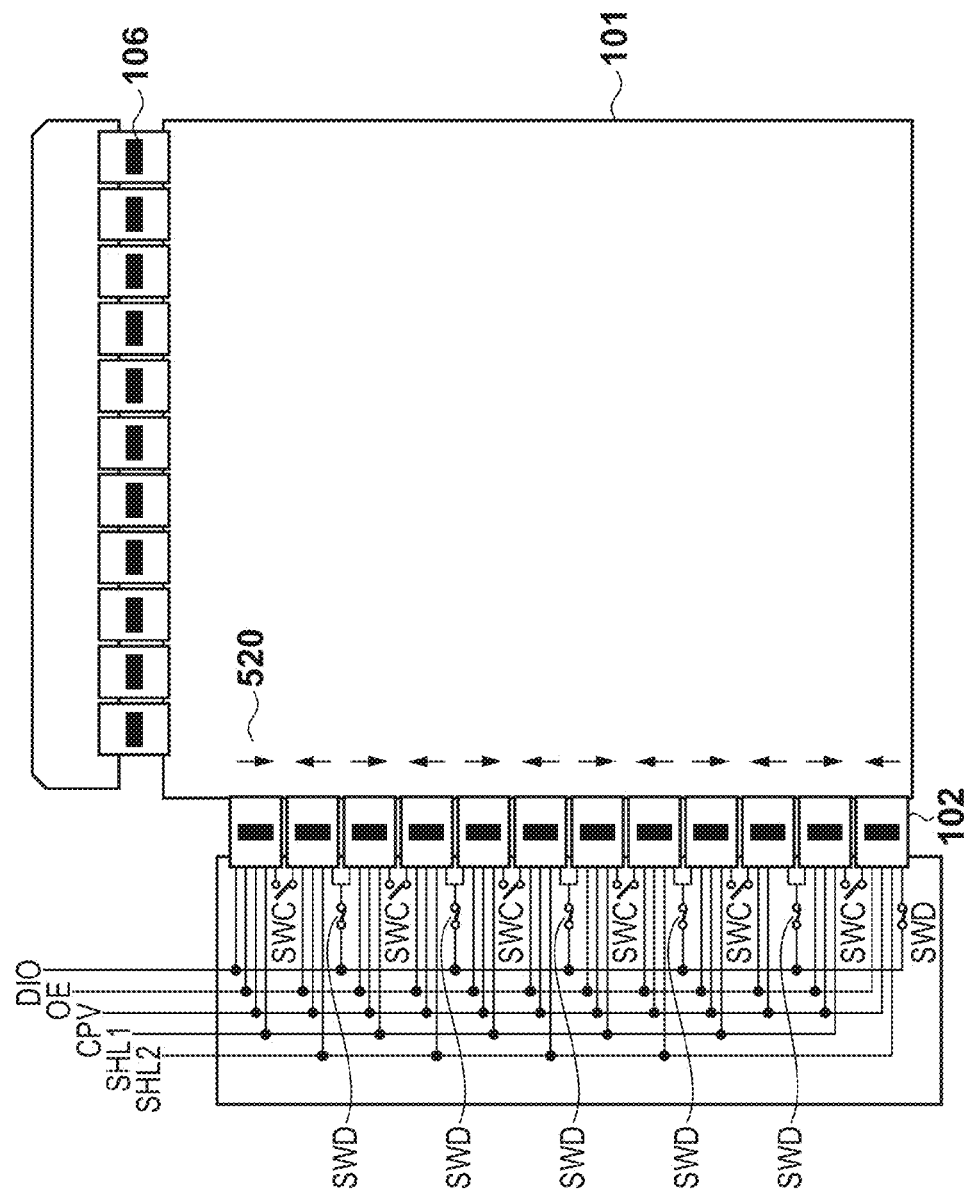

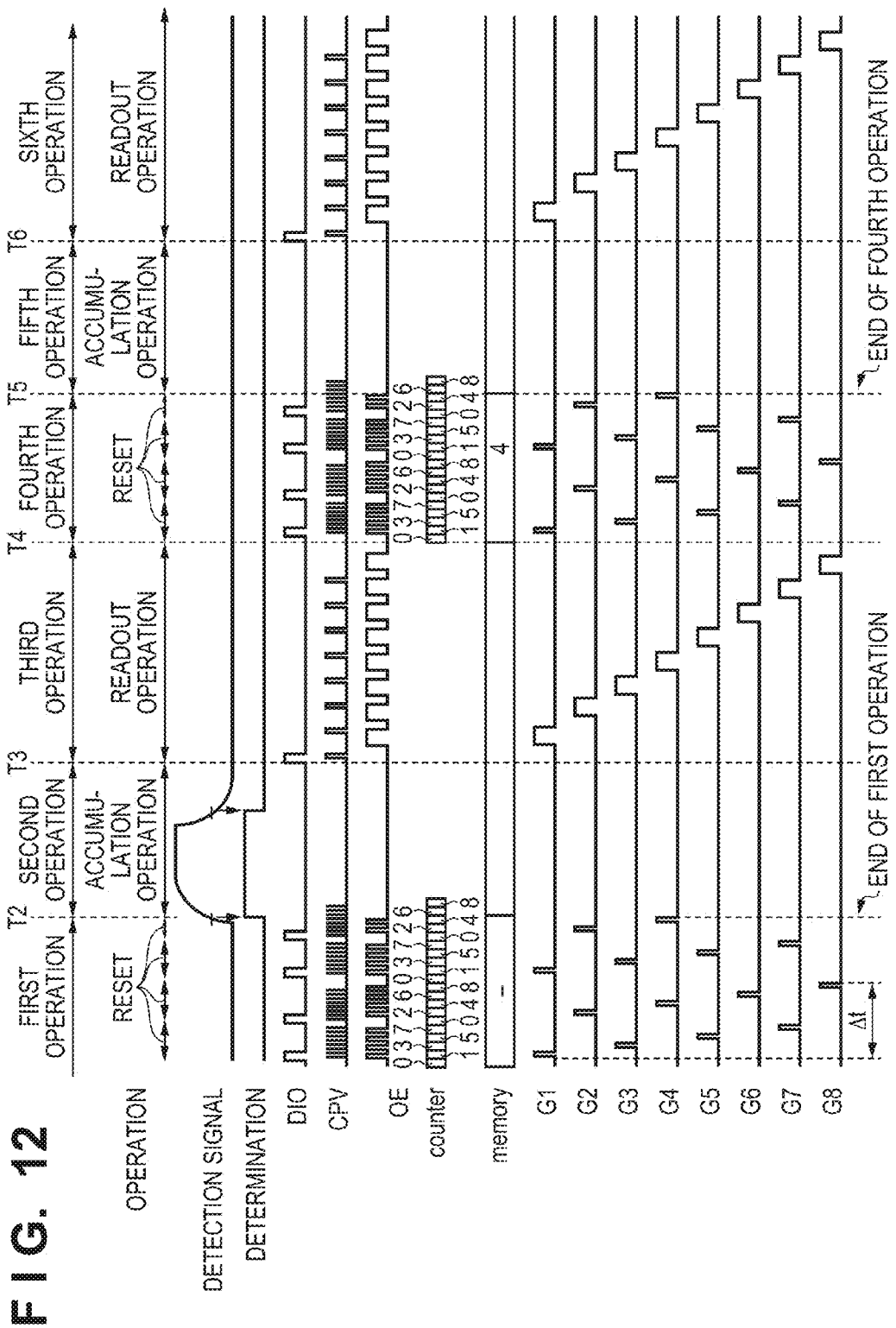

RADIATION IMAGING APPARATUS AND IMAGING SYSTEM

BACKGROUND OF THE INVENTION

1. Field of the Invention

The present invention relates to a radiation imaging apparatus and an imaging system.

2. Description of the Related Art

A radiation imaging apparatus including a pixel array obtained by arranging a plurality of pixels including transistors which supply desired potentials to conversion elements for converting X-rays or light into charges is required to reset the charge generated by the dark current generated in each of the plurality of pixels before irradiation with radiation. For this reason, a radiation imaging apparatus of this type is designed to perform the reset operation of periodically resetting charges in a plurality of pixels by periodically and sequentially setting the transistors of a plurality of pixels in a conductive state to reset voltages applied to conversion elements.

Japanese Patent Laid-Open No. 2007-151761 discloses a radiation imaging apparatus which resets voltages applied to conversion elements by using transfer switch elements for transferring signals corresponding to the charges generated by conversion elements as transistors to signal lines and to a circuit for processing the signals from the signal lines. This literature also discloses that the radiation imaging apparatus detects the irradiation of X-rays and interrupts reset operation in response to the irradiation of X-rays. Interrupting reset operation will shift to the accumulation operation of setting all the transistors in a non-conductive state to cause the pixels to accumulate charges corresponding to the irradiation of X-rays. The literature also discloses that after a predetermined period of time (accumulation time) has elapsed since the start of the accumulation operation, the apparatus starts actual read operation corresponding to the readout operation of sequentially reading out the charges as pixel signals. According to Japanese Patent Laid-Open No. 2007-151761, this method shortens the time between the irradiation of X-rays and the start of the operation of reading out image signals and also suppresses the occurrence of artifacts caused by reset operation.

Japanese Patent Laid-Open No. 2010-268171 discloses a technique of making the duration of the conductive state of each transistor in reset operation longer than the conducting time of each transistor in readout operation. This improves the reset efficiency.

Note that interrupting reset operation periodically performed in accordance with the irradiation of X-rays in the above manner will make the pixel array include the first block which has been reset before the interruption and the second block which has not been reset before the interruption. The first and second blocks differ in the accumulation time during which each transistor is maintained in a non-conductive state. This causes differences in noise signal value based on the dark current generated in each pixel during the accumulation time. This can cause a large density difference in the boundary portion between the first image region corresponding to the first block and the second image region corresponding to the second block. This will impair the reliability of a radiation image.

SUMMARY OF THE INVENTION

The present invention has been made in the recognition of the above problem by the inventor and is advantageous to obtain high-quality radiation images.

One of the aspects of the present invention provides a radiation imaging apparatus, comprising an imaging unit in which a plurality of pixels are arranged to form a plurality of rows and a plurality of columns, with each pixel including a conversion element for converting radiation into charges and a transistor having a gate, a source, and a drain with one of the source and the drain being connected to the conversion element and the other of the source and the drain being connected to a power source, a driving unit configured to apply one of a conducting voltage for setting the transistor in a conductive state and a non-conducting voltage for setting the transistor in a non-conductive state, to the gate of the transistor, and a control unit configured to control the driving unit so as to perform, a plurality of number of times, first operation of sequentially performing, for the plurality of rows, application of the conducting voltage to the gates of the transistors on at least one of the plurality of rows, stop applying the conducting voltage in the first operation in response to irradiation of the radiation, perform second operation of performing, for the plurality of rows, application of the non-conducting voltage to the gate of the transistor in response to an end of application of the conducting voltage in the first operation, and perform third operation of sequentially performing, for the plurality of rows, application of the conducting voltage to the gates of the transistors on at least one of the plurality of rows in response to an end of the second operation, wherein the control unit controls the driving unit so as to make a time required for each of the plurality of times of first operation shorter than a time required for the third operation and make a time during which the conducting voltage is applied in each of the plurality of times of first operation shorter than a time during which the conducting voltage is applied in the third operation.

Further features of the present invention will become apparent from the following description of exemplary embodiments with reference to the attached drawings.

BRIEF DESCRIPTION OF THE DRAWINGS

FIGS. 2A and 2B are views for explaining an example of a driving method according to the first embodiment;

FIGS. 5A to 5C are views for explaining the effects of the first embodiment;

FIGS. 7A and 7B are circuit diagrams for explaining an example of the arrangement of another part of the first embodiment;

FIG. 9 is a circuit diagram for explaining an example of the arrangement of another part of the first embodiment;

FIGS. 10A and 10B are views for explaining examples of an arrangement and a driving method according to the second embodiment;

FIG. 11 is a view for explaining an example of a driving method according to another embodiment;

FIG. 12 is a chart for explaining an example of another driving method according to the first embodiment.

DESCRIPTION OF THE EMBODIMENTS

<First Embodiment>

A radiation imaging apparatus 100 according to the first embodiment will be described below with reference to the accompanying drawings. This embodiment will exemplify a case in which a scheme of converting radiation into light by using a phosphor and then converting the light into electrical signals by photoelectric conversion is applied to the radiation imaging apparatus 100. However, the embodiment is not limited to this scheme. For example, a scheme of converting radiation into electrical signals by using a conversion element such as an amorphous silicon element may be applied to the radiation imaging apparatus 100. Assume that in the following description, radiation includes electromagnetic waves such as X-rays, α-rays, β-rays, and γ-rays.

Figure 1A:
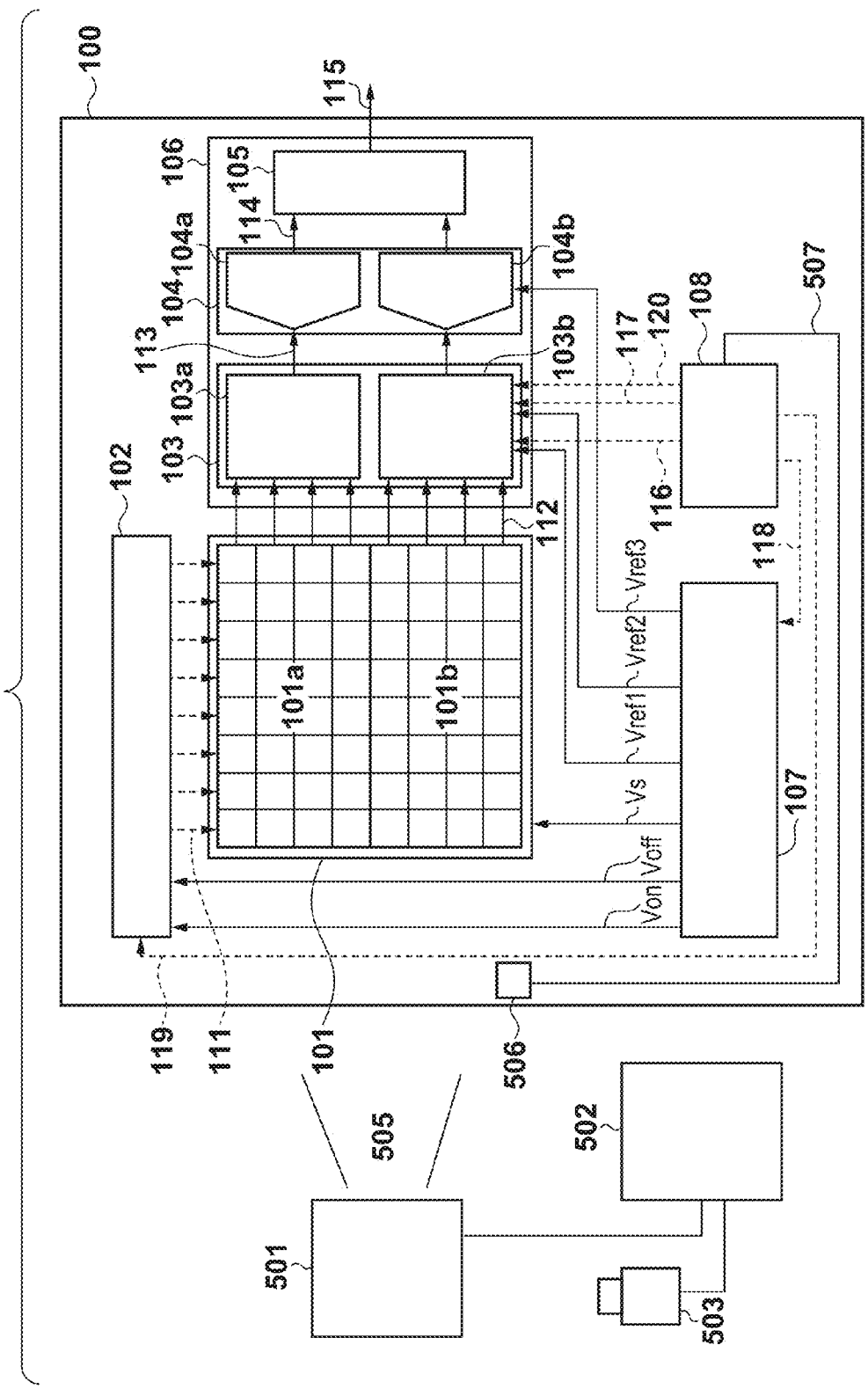
FIGS. 1A and 1B are views for explaining an example of the arrangement of the first embodiment.
Figure 1B:
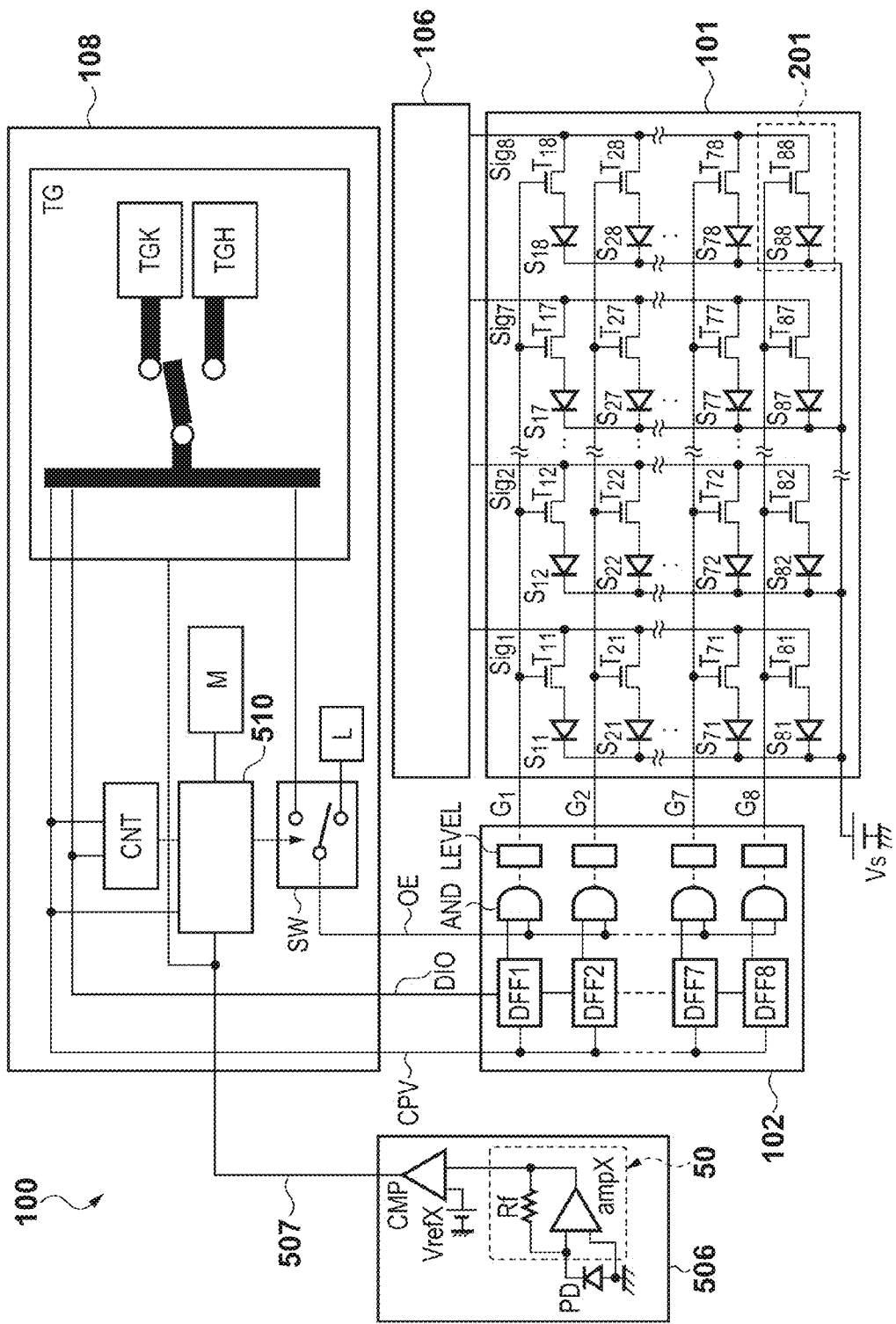

FIG. 1A is a block diagram for explaining an imaging system to which the radiation imaging apparatus 100 is applied. This imaging system can include, for example, the radiation imaging apparatus 100, a radiation source 501, an exposure switch 503, and a radiation controller 502. After the operator presses the exposure switch 503, the radiation source 501 can irradiate radiation 505 in accordance with a control signal from the radiation controller 502. A detection unit 506 of the radiation imaging apparatus 100 can detect the irradiation of radiation. This makes it possible to drive the radiation imaging apparatus 100 in accordance with the irradiation of radiation. The detection unit 506 is disposed in the radiation imaging apparatus 100 in this case. However, the detection unit 506 may be disposed in another place where it can detect irradiated radiation. FIG. 1B is a block diagram for explaining part of the radiation imaging apparatus 100. The radiation imaging apparatus 100 can include, for example, the detection unit 506, a control unit 108, a driving unit 102, an imaging unit 101, and a processing unit 106. The detection unit 506 detects the irradiation of radiation. The control unit 108 controls the operation of the imaging unit 101 by outputting control signals to the driving unit 102 which drives the imaging unit 101. The processing unit 106 processes the signal read out from the imaging unit 101.

The detection unit 506 can be disposed in any place where it can detect the irradiation of radiation, and may be disposed on, for example, part of the imaging unit 101 including a phosphor (not shown). In this case, the detection unit 506 can include, for example, a conversion element PD, an amplifier circuit 50 constituted by an amplifier ampX and a feedback resistor Rf, and a comparator CMP. As the conversion element PD, it is possible to use, for example, a PIN-type photodiode or MIS-type photoelectric conversion element using amorphous silicon. Light enters the conversion element PD upon irradiation of radiation, and the amplifier circuit 50 amplifies a corresponding signal. The comparator CMP compares this amplified signal with a reference potential VrefX, and outputs the result as a signal 507. In this manner, the detection unit 506 detects that radiation has been irradiated.

The imaging unit 101 has pixels 201 arranged to form a plurality rows and a plurality of columns. For the sake of simplicity, assume that the imaging unit 101 has the pixels 201 arranged to form 8 rows×8 columns. Signal lines $Sig_1$ to $Sig_8$ can be arranged in the imaging unit 101 so as to respectively correspond to the pixels 201 of the respective columns. For example, the pixel 201 on the mth row and nth column can include a conversion element $S_{mn}$ and a transistor $T_{mn}$. The conversion element $S_{mn}$ includes a semiconductor between two electrodes and can convert radiation or light into charges.

One electrode of the conversion element $S_{mn}$ can be electrically connected to the transistor $T_{mn}$, and the other electrode can be electrically connected to a sensor bias Vs. As the conversion element $S_{mn}$, it is possible to use, for example, a PIN-type photodiode or MIS-type photoelectric conversion element using amorphous silicon as a semiconductor. In addition, as the conversion element $S_{mn}$, it is possible to use an element which uses amorphous selenium as a semiconductor and directly converts radiation into charges. As the transistor $T_{mn}$, it is possible to use, for example, a thin-film transistor (TFT). The transistor $T_{mn}$ has a gate, source, and drain. One of the source and drain of the conversion element is connected to one electrode. A power source is connected to the other of the source and drain. In this embodiment, the other of the source and drain is connected to a constant voltage source (a reference voltage Vref1) as the power source of the processing unit 106. When a conducting voltage of a signal $G_m$ is supplied to the gate, the transistor $T_{mn}$ is turned on. A signal corresponding to the amount of charge accumulated in the conversion element $S_{mn}$ can be output to a signal line $Sig_n$. In this case, applying a predetermined constant voltage from the constant voltage source via the transistor $T_{mn}$ in a conductive state will reset the voltage in the conversion element and reset the charge generated by the conversion element. In this manner, the apparatus reads out signals corresponding to the charges accumulated in the conversion elements from the respective pixels 201 in accordance with the conducting voltages of signals G1 to G8, and can input the respective readout signals to the processing unit 106 via the signal lines $Sig_1$ to $Sig_8$. Each pixel 201 is then reset. The operation of sequentially setting the transistors $T_{mn}$ of the respective pixels 201 of a plurality of rows, with one of the source and drain of each transistor being connected to a corresponding conversion element and the other of the source and drain being connected to the constant voltage source will be referred to as reset operation.

The driving unit 102 can supply, to the gates of the transistors $T_{mn}$, the signals G1 to G8 each having a conducting voltage for setting the transistor $T_{mn}$ in a conductive state and a non-conducting voltage for setting the transistor $T_{mn}$ in a non-conductive state. The driving unit 102 includes, for example, D flip-flops (to be simply referred to as DFF 1 to DFF 8 and collectively referred to as DFFs hereinafter) in correspondence with the respective rows of the imaging unit 101 and can form a shift register. The driving unit 102 can include AND circuits and level shift circuits LEVEL in correspondence with the respective DFFs. The driving unit 102 can receive signals DIO, CPV, and OE from a timing generator TG. The signal DIO is a start pulse signal to be input to the DFF 1. The signal CPV is a shift lock signal for shifting the pulse held by each DFF to the next DFF. The signal OE is an output enable signal for deciding whether to output the state held by each DFF to the corresponding level shift circuit LEVEL. The level shift circuit LEVEL is a circuit for shifting a voltage level. In this manner, the driving unit 102 can selectively output a conducting voltage or non-conducting voltage held by each DFF to the imaging unit 101 when the signal OE is in high level. The driving unit 102 can also output a non-conducting voltage to the imaging unit 101 when the signal OE is in low level.

The control unit 108 can include a timing generator TG, a counter CNT, a unit 510, a storage unit M, and a switch SW. The unit 510 can store a value corresponding to the counter value of the counter CNT in the storage unit M in response to the irradiation of radiation in accordance with the signal 507 from the detection unit 506. The unit 510 can switch between connecting the signal OE to the timing generator TG and fixing the signal to low level by using the switch SW. The timing generator TG can generate two types of timings TGK and TGH. The details of this operation will be described later, together with a description of a driving method.

FIG. 2A is a timing chart for explaining the operation of the radiation imaging apparatus 100. FIG. 2A shows, from above, the operation state of the imaging unit 101, the output value of a detection signal for detecting the irradiation of radiation, and the determination result on the detection. FIG. 2A also subsequently shows the signals DIO, CPV, and OE, a counter value counter of the counter CNT, and information memory stored in the storage unit M. Furthermore, FIG. 2A subsequently shows the signals G1 to G8. The operation of the imaging unit 101 can include the first to sixth operations to be described below.

The first operation is the reset operation of periodically resetting each of the plurality of pixels 201 on at least row-by-row basis. In other words, the first operation is the operation of causing the driving unit 102 to sequentially perform, for a plurality of rows, the application of a conducting voltage to the gates of the transistors $T_{mn}$, on at least one of the plurality of rows of the pixels 201. The apparatus can repeatedly perform reset operation a plurality of number of times until radiation is irradiated. In this case, the period of reset operation is the time required to reset all the pixels 201, and is the time between the start of the resetting of a predetermined pixel of the pixels 201 which has been reset in advance and the start of the resetting of a predetermined pixel to be reset next. Alternatively, the period of reset operation is the time between the end of the resetting of a predetermined pixel of the pixels 201 which has been reset in advance and the end of the resetting of a predetermined pixel to be reset next. In this embodiment, the period of reset operation can be represented by the time obtained by multiplying the time during which a conducting voltage is applied to the transistors $T_{mn}$ per row by the number of rows. It is possible to perform reset operation corresponding to one period (the process of resetting all the pixels 201) by sequentially activating the signals G1 to G8 in accordance with the signal CPV after the signal DIO is input. This reset operation can periodically initialize noise signal components based on the dark currents generated in the respective pixels 201. After the signal DIO is input, the counter value counter can be sequentially counted from 1 to 8 in accordance with the signal CPV.

The control unit 108 controls the driving unit 102 so as to interrupt the first operation by stopping applying a conducting voltage in the first operation in accordance with the irradiation of radiation and shift to the second operation. The second operation is the accumulation operation of causing the driving unit 102 to apply a non-conducting voltage to the gate of the transistor $T_{mn}$ to set the transistor $T_{mn}$ in a non-conductive state so as to accumulate an electrical signal corresponding to the charge generated in the conversion element $S_{mn}$ in the pixel 201. In this embodiment, in accumulation operation, the driving unit 102 applies a non-conducting voltage to the gates of all the transistors $T_{mn}$ of the plurality of pixels 201. In the second operation, each pixel 201 accumulates an electrical signal corresponding to charge including the charge generated by the irradiation of radiation. In addition, the control unit 108 controls the driving unit 102 to perform the third operation of causing the driving unit 102 to sequentially perform, for a plurality of rows, the application of a conducting voltage to the gates of the transistors $T_{mn}$ on at least one of the plurality of rows of the pixels 201. The third operation is the readout operation of reading out pixel signals corresponding to the amounts of accumulated charges from the respective pixels 201 to the processing unit 106. In the second operation, the apparatus stores a value corresponding to the counter value counter in the storage unit M in accordance with the irradiation of radiation. In this case, the apparatus stores the value obtained by adding 1 to the counter value counter.

The control unit 108 controls the driving unit 102 to shift to the fourth operation in response to the end of the third operation. The fourth operation can include a plurality of times of reset operation (second reset operation). In other words, the fourth operation is the operation of causing the driving unit 102 to sequentially perform, for a plurality of rows, the application of a conducting voltage to the gates of the transistors $T_{mn}$ on at least one of the plurality of rows of the pixels 201. The apparatus terminates the fourth operation by stopping applying a conducting voltage to the row to which the application of a conducting voltage is stopped in the first operation after a plurality of times of the fourth operation. The apparatus performs this termination in accordance with, for example, the information memory stored in the storage unit M described above. In this case, the apparatus interrupts the fourth operation at the third period after performing reset operation corresponding to two periods. However, it is necessary to repeat this operation by the number of times necessary (for example, five times) to reset the charges generated by dark currents in the respective pixels 201. In this embodiment, it is preferable to terminate the fourth operation after repeating the reset operation five or more times.

The control unit 108 controls the driving unit 102 so as to interrupt the fourth operation by stopping applying a conducting voltage in the fourth operation in accordance with the first operation, thereby terminating the fourth operation, and shift to the fifth operation in response to the end of the fourth operation. Like the second operation, the fifth operation is the accumulation operation of causing the driving unit 102 to apply a non-conducting voltage to the gate of the transistor $T_{mn}$ to set the transistor $T_{mn}$ in a non-conductive state so as to accumulate an electrical signal corresponding to the charge generated in the conversion element $S_{mn}$ in the pixel 201. In the fifth operation, each pixel 201 is not irradiated with radiation and hence accumulates an electrical signal corresponding to the charge generated by a dark current. In addition, the control unit 108 controls the driving unit 102 so as to perform the sixth operation of causing the driving unit 102 to sequentially perform, for a plurality of rows, the application of a conducting voltage to the gates of the transistors $T_{mn}$ on at least one of the plurality of rows of the pixels 201. In the sixth operation, the apparatus reads out an electrical signal (dark pixel signal) corresponding to the charge generated by a dark current from each pixel 201 to the processing unit 106. A dark pixel signal includes a signal for correcting the offset component of the pixel 201. Thereafter, the processing unit 106 of the radiation imaging apparatus 100 can obtain an image signal (first image signal) concerning each pixel 201 and the second image signal obtained by a dark pixel signal. The processing unit 106 preferably calculates the difference between the first image signal and the second image signal to obtain the result as a radiation image. However, the present invention is not limited to this, and may calculate the difference by using another processing apparatus (not shown) provided outside the radiation imaging apparatus 100. As is obvious from FIG. 2A, in the radiation imaging apparatus 100, the period of the first operation is shorter than the time required for the third operation. The control unit 108 also controls the driving unit 102 so as to make the time during which a conducting voltage is applied in the first operation shorter than the time during which a conducting voltage is applied in the third operation. The control unit 108 can perform this operation by switching two types of timings TGK and TGH in the timing generator TG.

Figure 3:
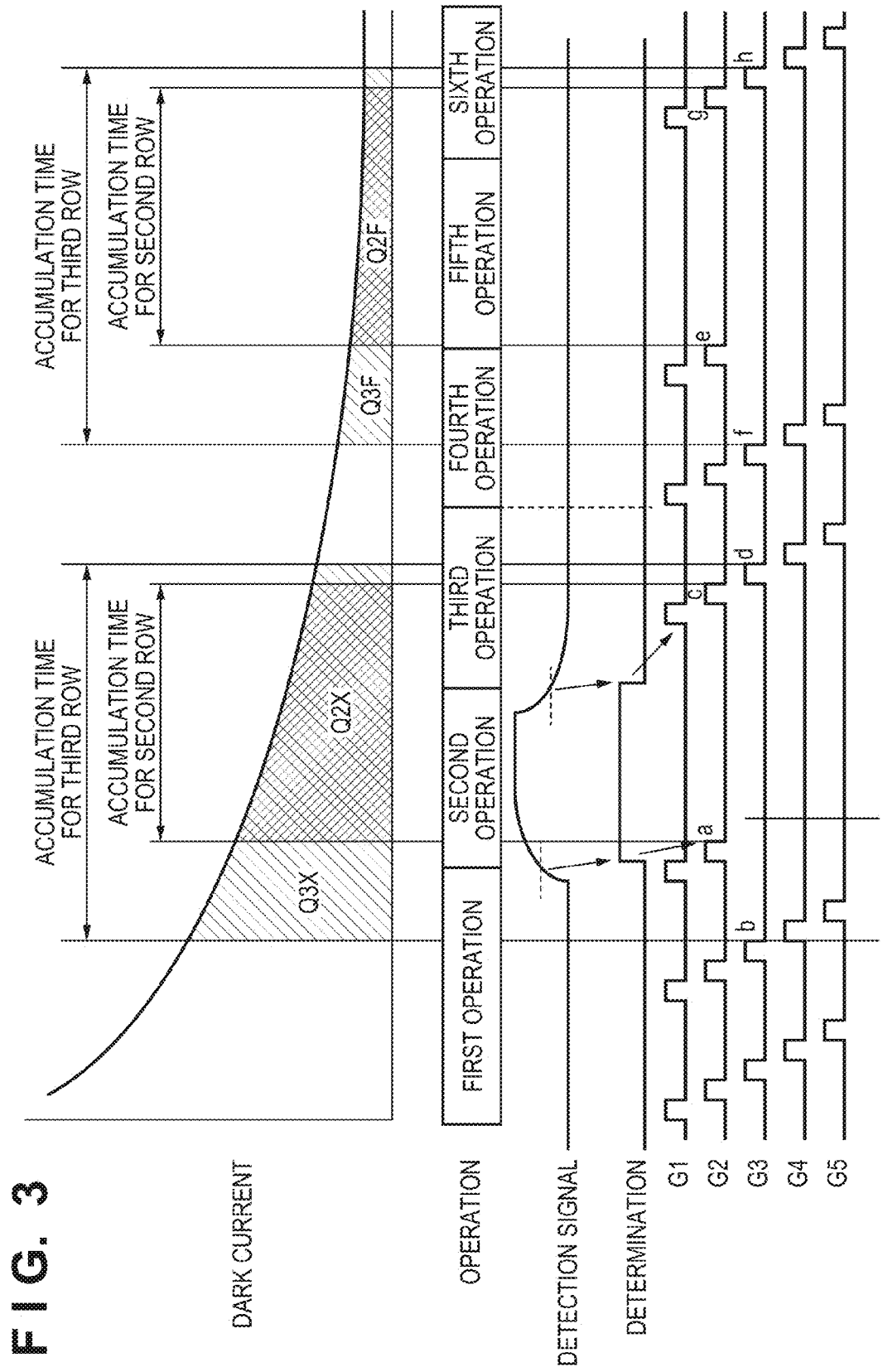
FIG. 3 is a view for explaining an example of a driving method according to a comparative example.
Figure 4A:
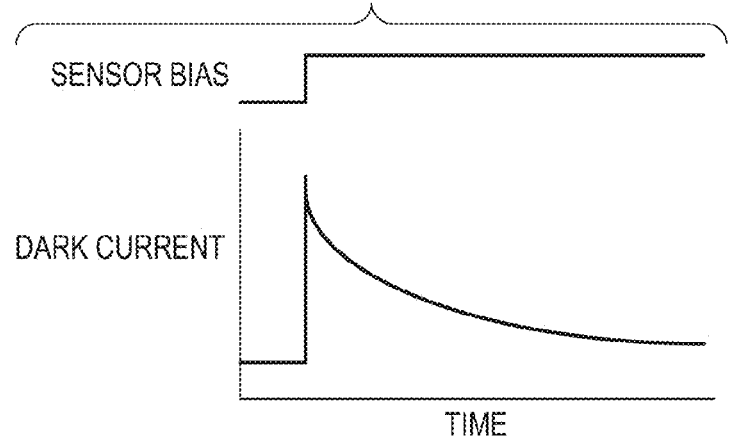
FIGS. 4A to 4C are graphs for explaining the response properties of dark currents.
Figure 4B:
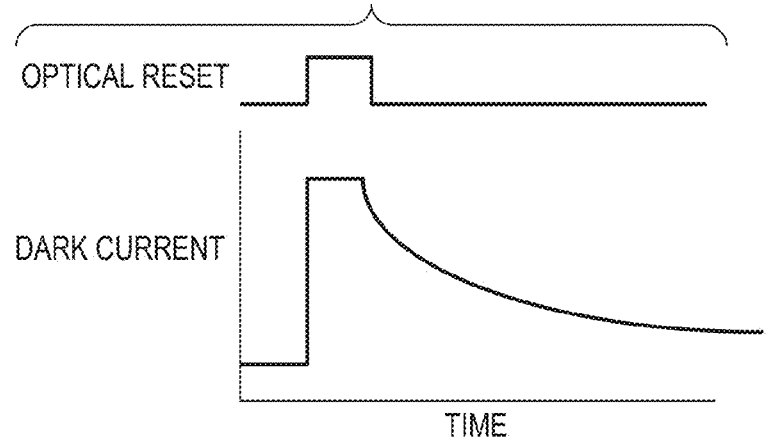
Figure 4C:
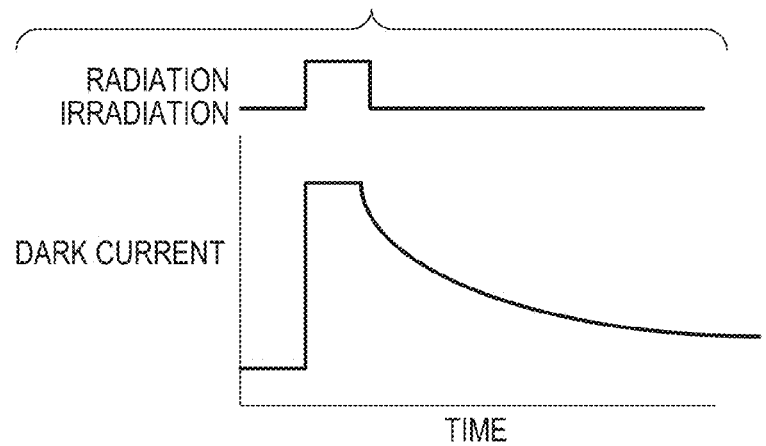

The effect obtained by making the period of the first operation shorter than the time required for the third operation by making the time during which a conducting voltage is applied in the first operation shorter than the time during which a conducting voltage is applied in the third operation will be described with reference to FIGS. 3 to 10B in comparison with a comparative example. The comparative example will be described first with reference to FIG. 3. The upper portion of FIG. 3 indicates the response property of a dark current which the pixel 201 has. FIG. 3 shows, below it, the operation state of the imaging unit 101, the output value of a detection signal for detecting the irradiation of radiation and the determination result on the detection. FIG. 3 also shows, below them, the signals G1 to G5, for the sake of simplicity. In the comparative example, the time during which a conducting voltage is applied in the first operation is equal to the time during which a conducting voltage is applied in the third operation, and the period of the first operation is equal to the time required for the third operation.

In this case, FIG. 3 shows a case in which radiation is irradiated when a conducting voltage is applied in accordance with the signal G2. Q2X in FIG. 3 corresponds to the quantity of charge accumulated in the pixel 201 on the second column in accumulation operation in the second operation, that is, the value obtained by integrating the response property of a dark current from a point a to a point c. Likewise, Q3X corresponds to the value obtained by integrating the response property of the dark current from a point b to a point d, Q2F corresponds to the value obtained by integrating the response property from a point e to a point g, and Q3F corresponds to the value obtained by integrating the response property from a point f to a point h.

The response property of a dark current with respect to the application of a sensor bias to the conversion element $S_{mn}$ is not often constant. For example, the imaging unit 101 exhibits a property like that shown in FIG. 4A which is obtained after the application of a sensor bias to the imaging unit 101. For example, the imaging unit 101 can use a method of reducing a residue image by irradiating light. In this case, the imaging unit 101 exhibits a property like that shown in FIG. 4B. In addition, for example, the imaging unit 101 can use a method of reducing a dark current by irradiating radiation. In this case, the imaging unit 101 exhibits a property like that shown in FIG. 4C. If, for example, a photodiode made of amorphous silicon is used, it requires about 60 sec to stabilize a dark current.

As described above, the driving unit 102 interrupts the first operation by stopping applying a conducting voltage in the first operation in accordance with the irradiation of radiation, and shifts to the second operation. This makes the imaging unit 101 include the first block to which a conducting voltage has been applied before the application of the conducting voltage is stopped and the second block to which no conducting voltage has been applied before the application of the conducting voltage is stopped. In the above case, the first block includes the pixels 201 on the first and second rows, and the second block includes the pixels 201 on the third to fifth rows. However, the above response properties of dark currents increase the differences between Q2X and Q3X and between Q2F and Q3F on the boundary portion (the second and third rows) between the first and second blocks. As a consequence, reading out the first and second image signals will generate a step in a signal output value on the boundary portion (to be referred to as the "step due to reset interruption" hereinafter). FIG. 5A shows the graph obtained by plotting the radiation images and output values obtained in the comparative example with respect to all the rows of the imaging unit 101. FIG. 5A shows a case in which both the time during which a conducting voltage is applied per row in the first operation and the time during which a conducting voltage is applied per row in the third operation are 66 μsec. As shown in FIG. 5A, a step due to reset interruption has been generated.

Figure 2B:
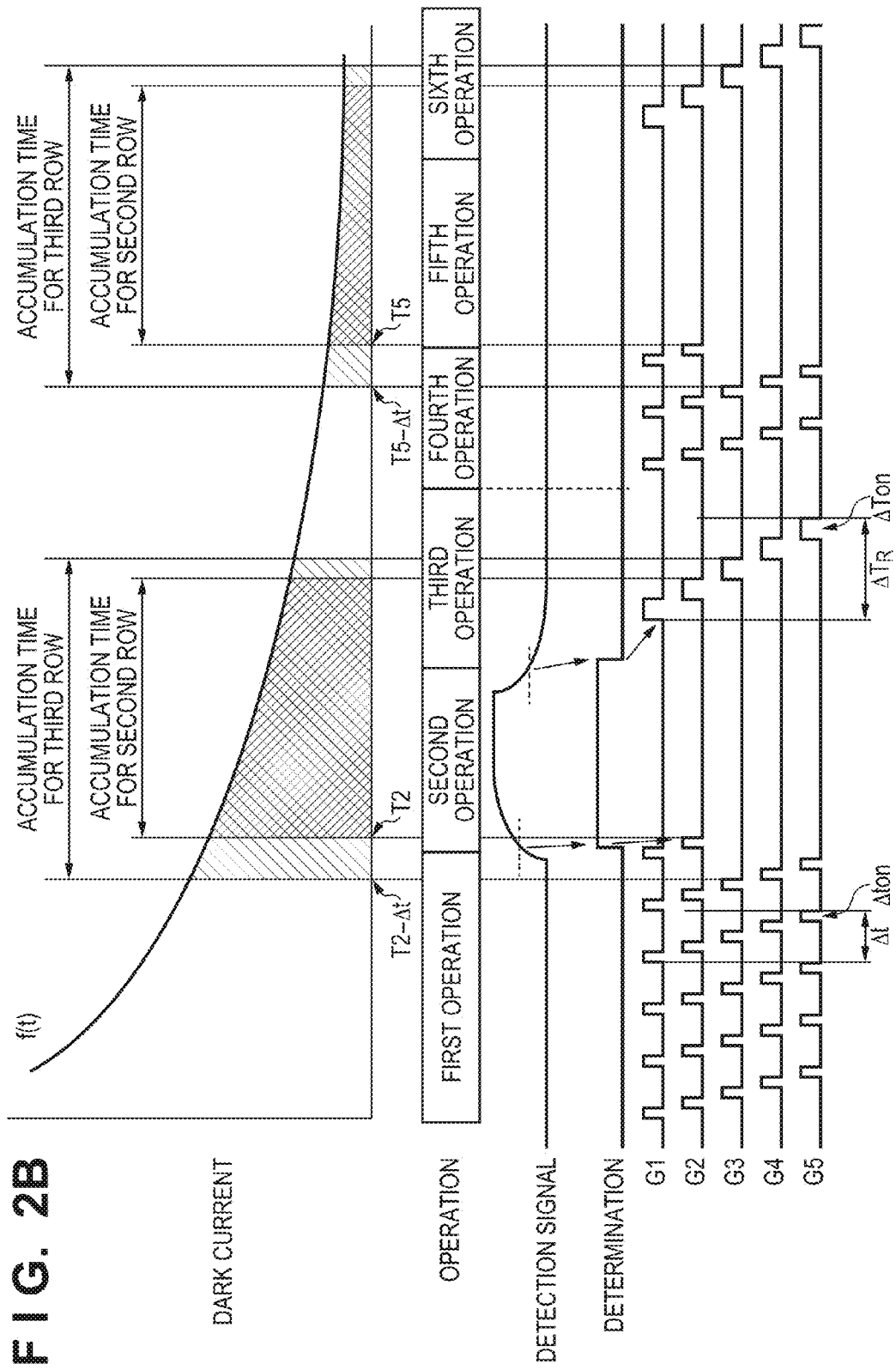

A case in which the period of the first operation is made shorter than the time required for the third operation by making a time Δton during which a conducting voltage is applied in the first operation shorter than a time ΔTON during which a conducting voltage is applied in the third operation will be described next with reference to FIG. 2B. FIG. 2B shows each state in correspondence with FIG. 3. The differences between Q2X and Q3X and between Q2F and Q3F in FIG. 2B are smaller than those in the comparative example shown in FIG. 3. This makes it possible to reduce the step due to reset interruption. FIG. 5B shows the radiation image acquired in the case shown in FIG. 2B and the graph obtained by plotting output values with respect to all the rows of the imaging unit 101. FIG. 5B shows a case in which the time during which a conducting voltage is applied per row in the first operation is 8 μsec, and the time during which a conducting voltage is applied per row in the third operation is 66 μsec. As described above, this embodiment can reduce the step due to reset interruption and obtain a high-quality radiation image. In addition, since the time Δton is shorter than the time ΔTON, when radiation is irradiated while a conducting voltage is applied to a given row in the first operation, the electrical signal transferred by the transistor $T_{mn}$ decreases. This can reduce the step due to reset interruption.

In addition, as shown in FIG. 2B, letting Δton be the time during which a conducting voltage is applied in the first operation, x be the number of rows, and Δt be the period of the first operation, Δton*x=Δt can hold. In addition, letting T2 be the start time of the second operation and T4 be the start time of the fourth operation, Δt<(T4−T2)/10 preferably holds. Furthermore, letting T5 be the start time of the fifth operation and f(t) be the response property of a dark current in the conversion element $S_{mn}$, the following relationship preferably holds:

$$\left| \int_{T2-\Delta t}^{T2} f(t)dt - \int_{T5-\Delta t}^{T5} f(t)dt \right| \leq (2 \times \sigma)$$

where σ indicates the standard deviation of the image signal obtained by calculating the difference between the first and second image signals. This makes the differences between Q2X and Q3X and between Q2F and Q3F sufficiently smaller than the absolute values of Q2X and Q3X and of Q2F and Q3F, and hence can reduce the step due to reset interruption.

Figure 5C:
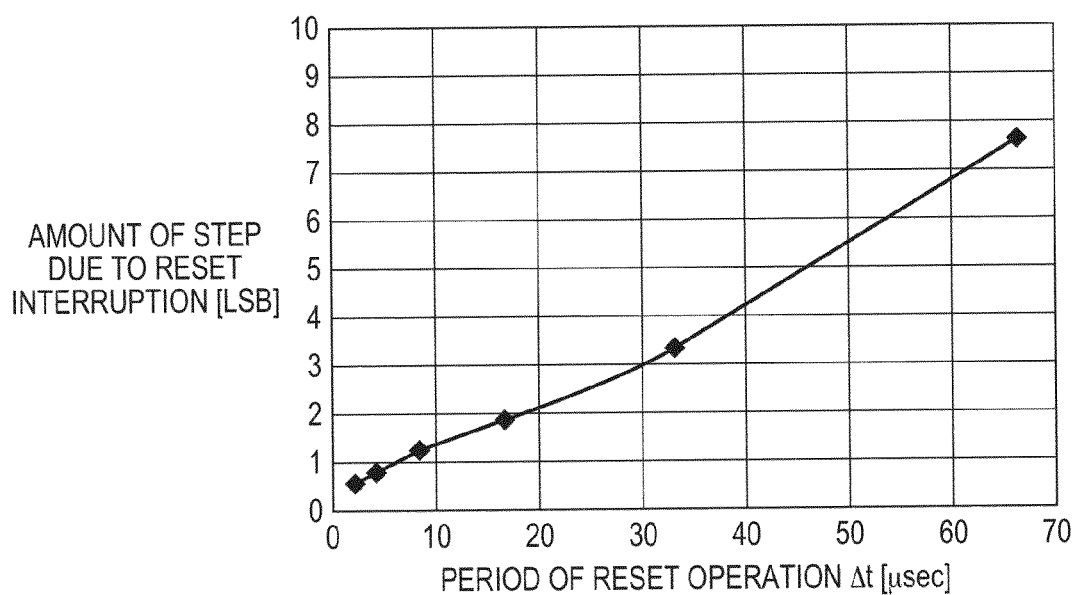

FIG. 5C shows the result obtained by plotting with the abscissa representing the time Δton during which a conducting voltage is applied in the first operation and the ordinate representing the amount of step due to reset interruption. As is obvious from FIG. 5C, reducing the time Δton during which a conducting voltage is applied in the first operation will reduce the step due to reset interruption.

Figure 6:
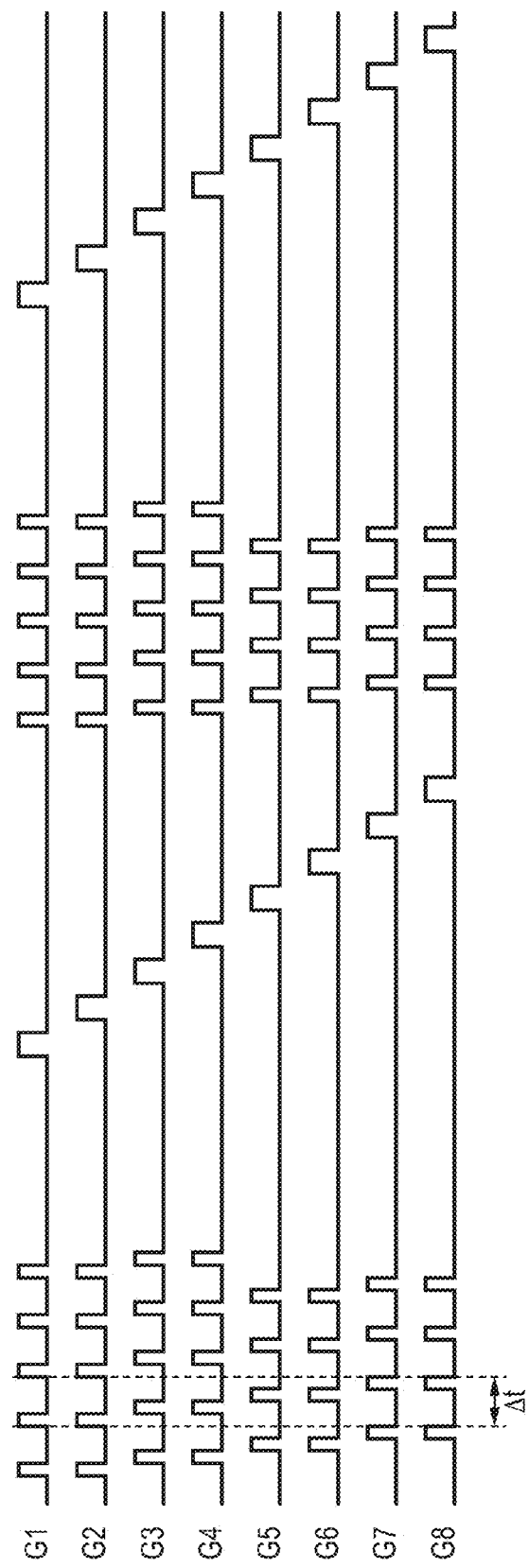
FIG. 6 is a chart for explaining an example of another driving method according to the first embodiment.

FIG. 6 shows a case in which the first and fourth operations described above are performed for two rows of the pixels 201 at a time. This makes it possible to further reduce the period Δt of the first and fourth operations to ½. The period Δt of first and fourth operations is almost equal to the time obtained by multiplying Δton by the number of rows. For this reason, as is obvious from FIG. 5C, the period Δt of the first and fourth operations is almost proportional to the amount of step due to reset interruption. Therefore, performing the first and fourth operations for two rows at a time will reduce the amount of step to ½. It is possible to perform the first and fourth operations for two or more rows at a time. This can obtain a radiation image with higher quality.

Figure 13:
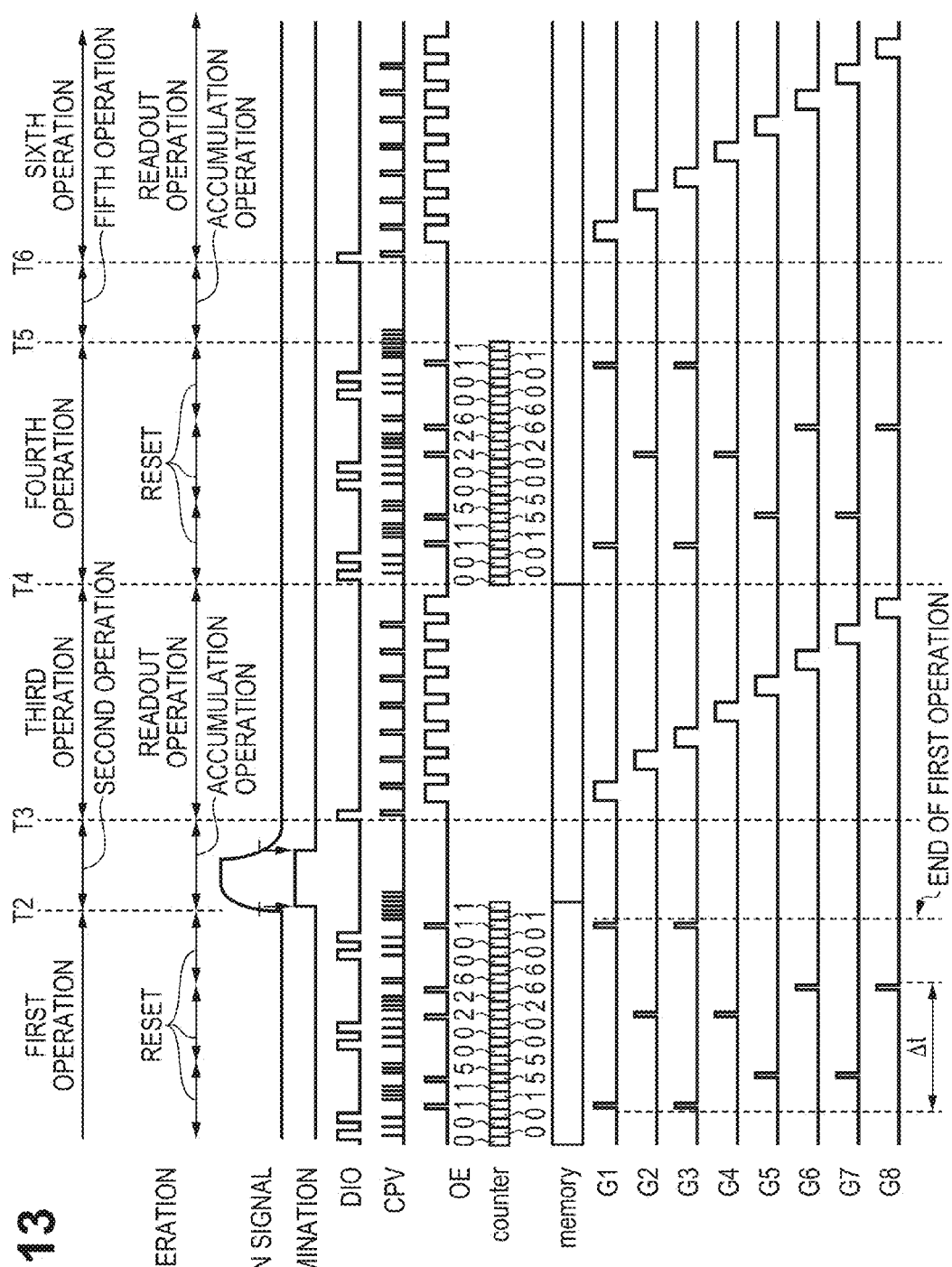
FIG. 13 is a chart for explaining an example of still another driving method according to the first embodiment.

The order of execution of the first and fourth operations is not limited to that described above as long as the step due to reset interruption is reduced. For example, as shown in FIG. 12, the apparatus may repeatedly perform resetting on odd-numbered rows for one row at a time and resetting on even-numbered rows for one row at a time. Alternatively, the above order may be set to perform resetting on odd-numbered rows for two rows at a time and resetting on even-numbered rows for two rows at a time, as shown in FIG. 13. In the examples as shown in FIGS. 12 and 13, the period of time, in the first operation, for supplying the conducting voltage to the gate of transistors $T_{mn}$, is 16 [µsec] for each row, and the period of time, in the third operation, for supplying the conducting voltage to the gate of transistors $T_{mn}$, is 66 [µsec] for each row. And the period of time, in the first operation, between the end of supplying the conducting voltage to a certain row and the start of supplying the conducting voltage to the next row in the first operation, is 16 [µsec].

Figure 7B:
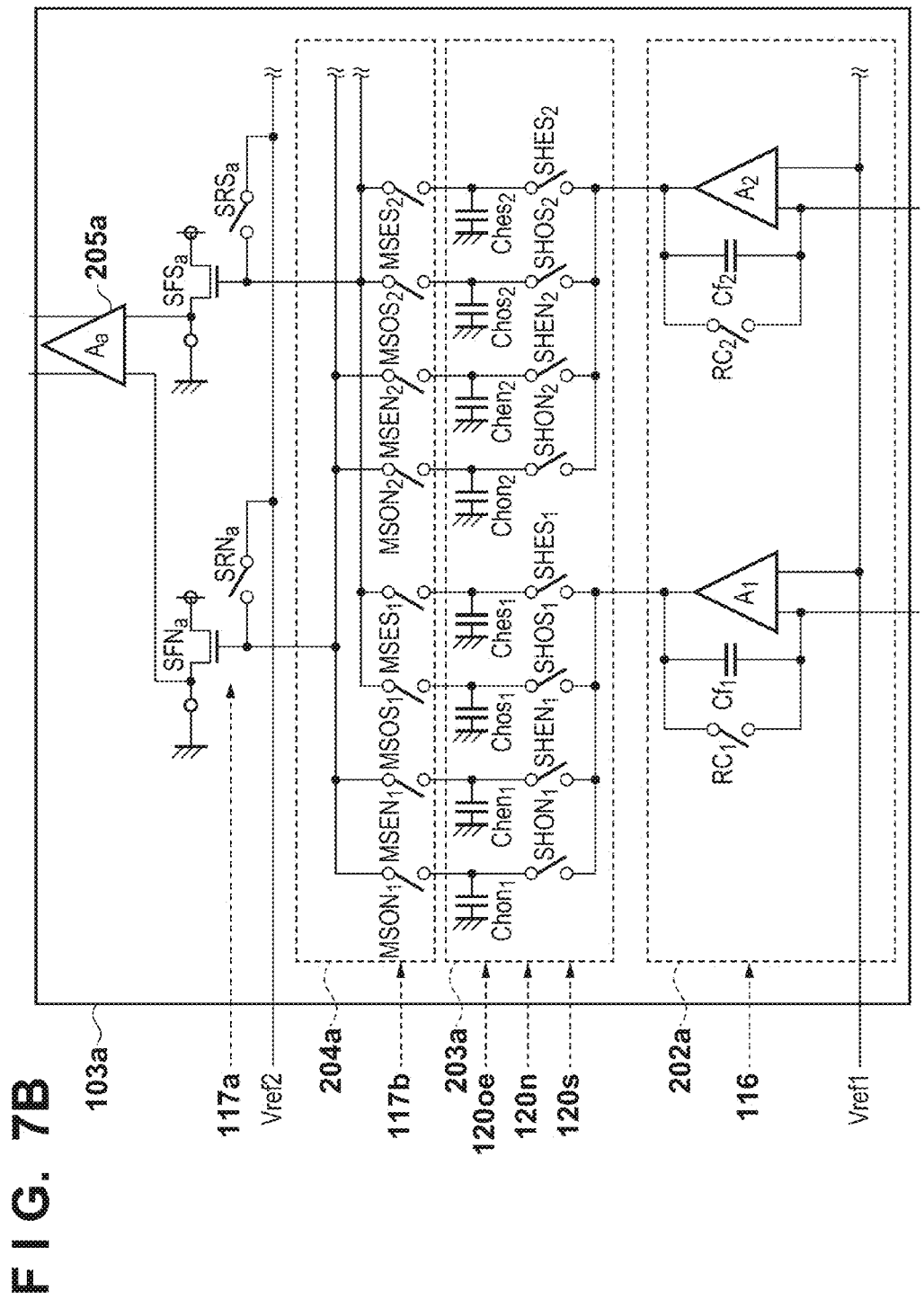

An example of a method of processing the signal read out from each pixel 201 will be described below with reference to FIGS. 7A and 7B. FIG. 7A shows a concrete example of the arrangement of the processing unit 106. The radiation imaging apparatus 100 can further include a power source control unit 107. The power source control unit 107 controls power sources (including Vref1, Vref2, Vref3, Vs, and a power source (not shown)) to be respectively supplied to the imaging unit 101, the driving unit 102, and the processing unit 106 described above in accordance with control signals 118 from the control unit 108. The control unit 108 can output control signals for the processing unit 106 for controlling the processing unit 106 in addition to the signals 118 including the signals CPV, DIO, and OE, as described above. The control signals for the processing unit 106 can include signals 116, 117a, 117b, 120oe, 102n, and 120s.

The processing unit 106 can include readout units 103a and 103b, analog/digital conversion units 104a and 104b, and a digital signal processing unit 105. As exemplified by FIG. 7B, the readout unit 103a includes an amplifier unit 202a, an SH unit 203a, a multiplexer 204a, and a variable amplifier 205a. The amplifier unit 202a can include a plurality of amplifier circuits corresponding to the respective rows of the imaging unit 101. For example, the nth-column amplifier circuit can include an operational amplifier $A_n$, a feedback capacitor $Cf_n$, and a reset switch $RC_n$. A reference voltage Vref1 can be input to the non-inverting input terminal (indicated by "+") of the operational amplifier $A_n$. In this embodiment, a power source for applying the reference voltage Vref1 corresponds to a constant voltage source in the present invention. The SH unit 203a can include a plurality of sample/hold circuits. For example, the nth-column sample/hold circuit can include a plurality of switches $SHON_n$, $SHOS_n$, $SHEN_n$, and $SHES_n$, and a plurality of capacitors $Chon_n$, $Chos_n$, $Chen_n$, and $Ches_n$. The multiplexer 204a can include a switch group corresponding to each column. For example, switches $MSON_n$, $MSOS_n$, $MSEN_n$, and $MSES_n$ can be arranged on the nth column. The multiplexer 204a can input the signals read out from the respective rows of the imaging unit 101 to the variable amplifier 205a via source-follower transistors SFNa and SFSa while switching the above switch groups. In this manner, the readout unit 103a can sequentially read out S signals including the amplified first image signals and N signals as the offset portions of amplified portions from the signals read out from the respective rows of the imaging unit 101, and amplify and output these differences. Although the readout unit 103a has been described above, the same applies to the readout unit 103b.

In this case, the pixels 201 of the imaging unit 101 can be divided into a first pixel group 101a and a second pixel group 101b. The first pixel group 101a includes pixels 101 on the first to eighth rows and the first to fourth columns. The second pixel group 101b can include the pixels 101 on the first to eighth rows and the fifth to eighth columns. The readout unit 103a can read out a signal from each pixel 201 included in the first pixel group 101a. The analog/digital conversion unit 104a can convert each readout signal into a digital signal. Likewise, the second pixel group 101b can read out each signal and covert it into a digital signal. Each converted digital signal is input to the signal processing unit 105, which performs predetermined signal processing for the signal. The signal processing unit 105 can output the resultant signal to a display unit (not shown) via a wiring 115.

Figure 8A:
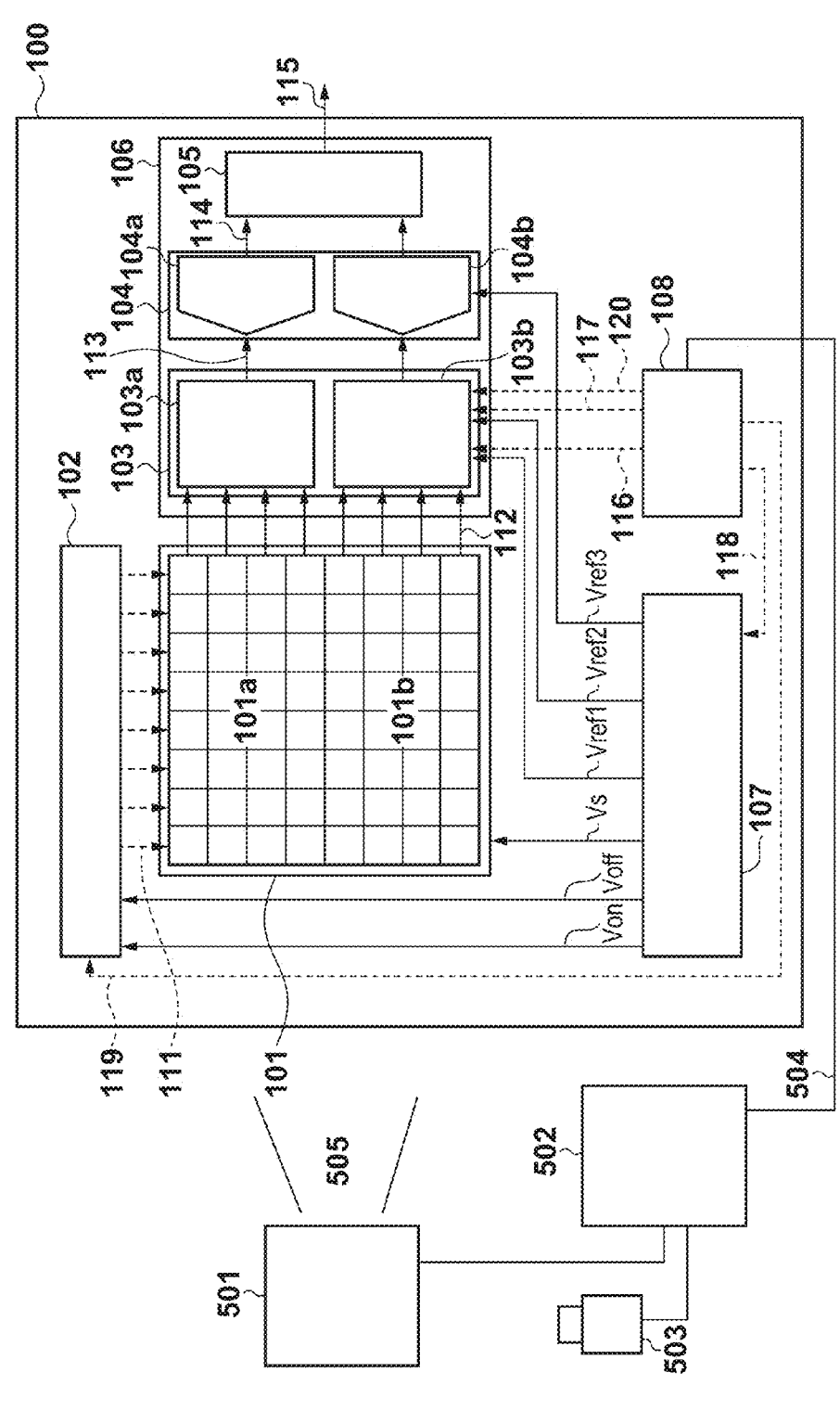
FIGS. 8A and 8B are views for explaining an example of an imaging system to which the first embodiment is applied.

As exemplified by FIG. 8A, the radiation imaging apparatus 100 can be applied to an imaging system in another form. The imaging system shown in FIG. 8A differs from that shown in FIG. 1A in that the control unit 108 can directly detect the irradiation of radiation in accordance with a control signal 504 from the radiation controller 502. As described above, the radiation imaging apparatus 100 can be applied to the imaging system regardless whether the apparatus uses a wired or wireless method of detecting radiation.

Figure 8B:
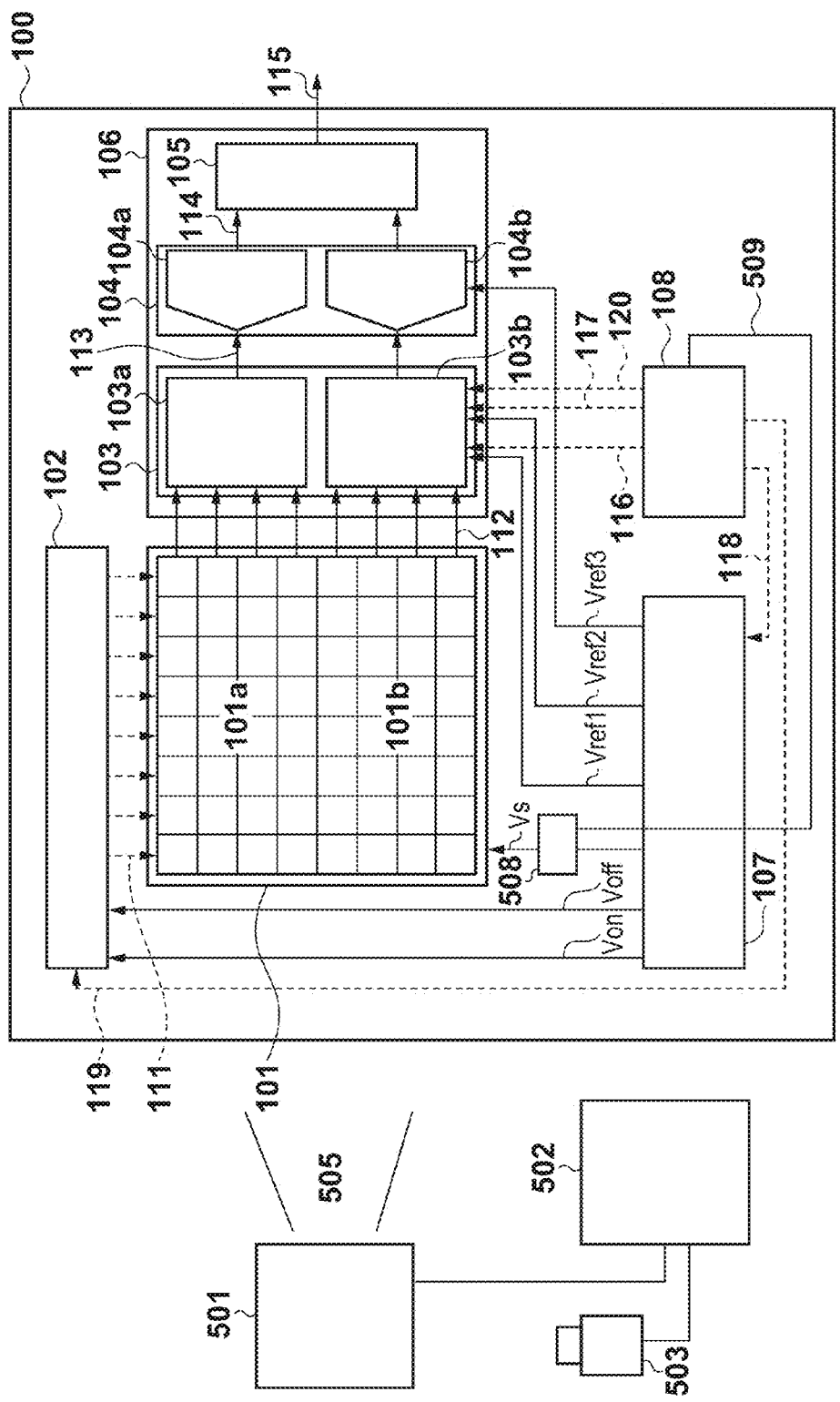

In addition, as exemplified by FIG. 8B, the radiation imaging apparatus 100 can be applied to an imaging system in another form. This imaging system detects the irradiation of radiation by detecting a change in the current of the sensor bias Vs. This change in current can be detected by making the radiation imaging apparatus 100 include a current detection unit 508. In this case, the radiation imaging apparatus 100 may use the structure exemplified by FIG. 9. As described above, the radiation imaging apparatus 100 can use various methods of detecting radiation and can be applied to imaging systems in various forms.

In order to continuously image many patients within a short period of time, it is efficient to set the time from the instant a bias is applied to the imaging unit 101 to the instant the second operation is started to, for example, 60 sec or less. When the imaging unit 101 uses a method of reducing dark currents by irradiating radiation, the time from the instant the imaging unit 101 is irradiated with light to the instant the second operation is started may be set to 60 sec or less. In addition, the time required for the series of operations including the first to sixth operations may be set to 60 sec or less.

<Second Embodiment>

Figure 10A:
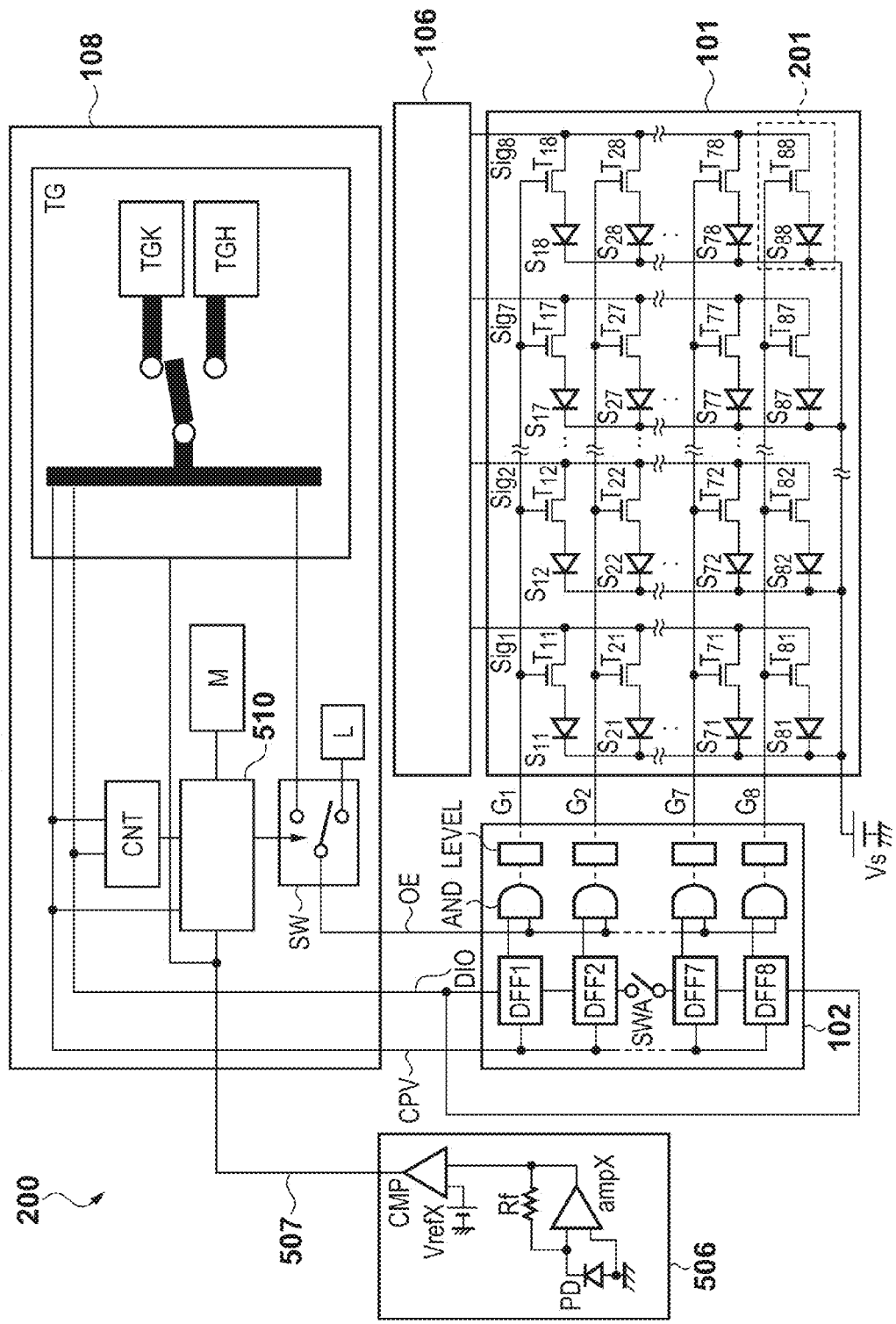

A radiation imaging apparatus 200 according to the second embodiment will be described with reference to FIGS. 10A, 10B, and 11. The same reference numerals as those in FIGS. 10A, 10B, and 11 denote the same components in the first embodiment, and hence a description of them will be omitted. FIG. 10A is a block diagram for explaining an example of an imaging system which drives the radiation imaging apparatus 200. The second embodiment differs from the first embodiment in that signals DIO are input from both the DFF 1 side the DFF 8 side.

FIG. 10B is a timing chart for driving the radiation imaging apparatus 200 in the same manner as shown in FIG. 2A in the first embodiment. In the radiation imaging apparatus 200, a driving unit 102 can apply a conducting voltage in the order of signals G1 to G4. At the same time, the driving unit 102 can apply a conducting voltage in the order of signals G8 to G5. That is, it is possible to sequentially reset the pixels 201 from the first and eighth rows toward the middle rows (the fourth and fifth rows) in an imaging unit 101. This can reduce a period Δt of reset operation to ½, and hence can reduce the step of density difference which can be caused in a radiation image obtained afterward. In addition, in the above case, the apparatus sequentially resets the pixels 201 from the upper and lower ends toward the middle rows of the imaging unit 101, and hence reduces the generation of the step of signal values on the middle rows. The apparatus may sequentially perform reset operation from the middle rows toward the upper and lower ends of the imaging unit 101. In this case, in the radiation imaging apparatus 200, the driving unit 102 may be controlled to sequentially apply a conducting voltage in the order of the signals G4 to G1 while sequentially applying a conducting voltage in the order of the signals G5 to G8.

An application of the second embodiment will be described with reference FIG. 11. For the sake of simplicity, FIG. 11 schematically shows a radiation imaging apparatus including the imaging unit 101, the driving unit 102, and a processing unit 106. Each arrow 520 in FIG. 11 indicates the direction of scanning in the imaging unit 101 in the first and fourth operations by the driving unit 102, that is, the order of resetting in the imaging unit 101. The direction of scanning in the imaging unit 101 is decided by signals SHL1 and SHL2. In this case, the apparatus resets the pixels 201 for 12 rows at a time by inputting the signal DIO to the driving unit 102, and hence can reduce the period Δt of reset operation to ¹⁄₁₂.

In this manner, it is possible to perform reset operation as the first and fourth operations for each of a plurality of regions in the imaging unit 101 individually. The order of resetting a plurality of pixels 201 included in each of the plurality of regions is made to differ from that in an adjacent region. This reduces the generation of the step of noise signal values on the boundary portion between adjacent regions. According to this embodiment, therefore, it is possible to obtain high-quality radiation images.

Although the two embodiments have been described above, the present invention is not limited to them, the object, state, application, function, and other specifications can be changed as needed, and can be carried out by other embodiments. In the above embodiments, it has been shown that each pixel 201 has a structure to perform the reset operation and the readout operation by setting transistor $T_{mn}$ in a conductive state and transferring charges generated in a conversion element $S_{mn}$ to a signal line $Sig_n$, so called destructive readout. But the structure of the pixel 201 is not limited to the above one. Each pixel 201 might have another structure publicly known, for example, a structure for performing non-destructive readout, comprised with a plurality of transistors (such as transfer transistor, amplifier transistor and reset transistor). In that case, a control signal for transferring charges (first signal) might be supplied to pixel 201 (the transfer transistor in pixel 201) for the readout operation, and a control signal for resetting pixel 201 (second signal) might be supplied to pixel 201 (the reset transistor in pixel 201) for the reset operation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-061148, filed Mar. 16, 2012, and 2013-013734, filed Jan. 28, 2013, which are hereby incorporated by reference herein in their entirety.

What is claimed is:

1. A radiation imaging apparatus comprising:

an imaging unit in which a plurality of pixels are arranged to form a plurality of rows and a plurality of columns, with each pixel including a conversion element for converting radiation into charges and a transistor having a gate, a source, and a drain with one of the source and the drain being connected to the conversion element and the other of the source and the drain being connected to a power source;

a driving unit configured to apply one of a conducting voltage for setting the transistor in a conductive state and a non-conducting voltage for setting the transistor in a non-conductive state, to the gate of the transistor; and a control unit configured to control said driving unit so as to perform, a plurality of number of times, first operation of sequentially performing, for the plurality of rows, application of the conducting voltage to the gates of the transistors on at least one of the plurality of rows, stop applying the conducting voltage in the first operation in response to irradiation of the radiation, perform second operation of performing, for the plurality of rows, application of the non-conducting voltage to the gate of the transistor in response to an end of application of the conducting voltage in the first operation, and perform third operation of sequentially performing, for the plurality of rows, application of the conducting voltage to the gates of the transistors on at least one of the plurality of rows in response to an end of the second operation, wherein said control unit controls said driving unit so as to make a time required for each of the plurality of times of first operation shorter than a time required for the third operation and make a time during which the conducting voltage is applied in each of the plurality of times of first operation shorter than a time during which the conducting voltage is applied in the third operation.

2. The apparatus according to claim 1, wherein said control unit controls said driving unit, in a plurality of times of fourth operation of sequentially performing, for the plurality of rows, application of the conducting voltage to the gates of the transistors on at least one of the plurality of rows in response to an end of the third operation, so as to stop application of the conducting voltage in the fourth operation at a row, of the plurality of rows, to which application of the conducting voltage in the first operation is stopped, perform fifth operation of performing, for the plurality of rows, application of the non-conducting voltage to the gate of the transistor in response to an end of application of the conducting voltage in the fourth operation, and perform sixth operation of sequentially performing, for the plurality of rows, application of the conducting voltage to the gates of the transistors on at least one of the plurality of rows in response to an end of the fifth operation.

3. The apparatus according to claim 2, further comprising a processing unit configured to obtain a first image signal obtained by the third operation and a second image signal obtained by the sixth operation.

4. The apparatus according to claim 3, wherein said processing unit calculates and obtains a difference between the first image signal and the second image signal.

5. The apparatus according to claim 2, wherein letting Δton be a time during which a conducting voltage is applied in the first operation, x be the number of rows of the plurality of rows, Δt be a period of the first operation, T2 be a start time of the second operation, and T4 is a start time of the fourth operation, a relationship given by $$\Delta ton * x = \Delta t < (T4-T2)/10$$

holds.

6. The apparatus according to claim 1, wherein the first operation is performed for each of a plurality of regions in said imaging unit, each of the plurality of regions includes a plurality of the pixels constituting a plurality of rows, and an order in which the plurality of pixels included in each of the plurality of regions are periodically reset for at least one row at a time differs from that in the adjacent region.

7. The apparatus according to claim 3, wherein letting Δt be a period of the first operation or the fourth operation, T2 be a start time of the second operation, T5 be a start time of the fifth operation, f(t) be a response property of a dark current in the conversion element, and σ be a standard deviation of an image signal which is obtained by calculating a difference between the first image signal and the second image signal, a relationship given by $$|\int_{T2-\Delta t}^{T2} f(t)dt - \int_{T5-\Delta t}^{T5} f(t)dt| \le (2 \times \sigma)$$

holds.

8. The apparatus according to claim 1, wherein a time from the instant a bias is applied to said imaging unit to the instant the second operation is started is not more than 60 sec.

9. The apparatus according to claim 1, wherein a time from the instant said imaging unit is irradiated with light to the instant the second operation is started is not more than 60 sec.

10. The apparatus according to claim 2, wherein a series of operations from the first operation to the sixth operation are performed within 60 sec.

11. The apparatus according to claim 1, wherein the conversion element in each of the pixels includes a layer having a phosphor which converts radiation into light and a photoelectric conversion element.

12. An imaging system comprising:
a radiation imaging apparatus defined in claim 1; and
a radiation source for generating the radiation.

13. A radiation imaging apparatus comprising:
an imaging unit in which pixels including conversion elements for converting radiation into charges are arranged to form a plurality of rows and a plurality of columns;
a driving unit configured to initialize each of the conversion elements by supplying a first signal to each of the pixels, or cause each of the conversion elements to sequentially output a signal by supplying a second signal to each of the pixels; and
a control unit configured to control said driving unit so as to perform, a plurality of number of times, first operation of performing, for the plurality of rows, supply of the first signal to the pixels on at least one of the plurality of rows, perform second operation of stopping the first operation in response to irradiation of the radiation and then causing the pixels to accumulate charges, and perform third operation of sequentially performing, for the plurality of rows, supply of the second signal to the pixels on at least one of the plurality rows in response to an end of the second operation,
wherein a time required for each of the plurality of times of first operation is shorter than a time required for the third operation, and a time during which the first signal is supplied in each of the plurality of times of first operation is shorter than a time during which the second signal is supplied in the third operation.

14. The apparatus according to claim 13, wherein said control unit controls said driving unit so as to perform, a plurality of times, fourth operation of sequentially performing, for a plurality of rows, supply of the first signal to the pixels on at least one of the plurality of rows in response to an end of the third operation, perform fifth operation of stopping supply of the first signal in the fourth operation at a row, of the plurality of rows, to which supply of the first signal in the first operation is stopped and then causing the pixels to accumulate charges, and perform sixth operation of sequentially performing, for the plurality of rows, supply of the second signal to the pixels on at least one of the plurality of rows in response to an end of the fifth operation.

15. The apparatus according to claim 14, further comprising a processing unit configured to obtain a first image signal obtained by the third operation and a second image signal obtained by the sixth operation.

16. The apparatus according to claim 15, wherein said processing unit calculates and obtains a difference between the first image signal and the second image signal.

17. The apparatus according to claim 13, wherein the conversion element in each of the pixels includes a layer having a phosphor which converts radiation into light and a photoelectric conversion element.

18. An imaging system comprising:
a radiation imaging apparatus defined in claim 13; and
a radiation source for generating the radiation.

* * * * *